US007482757B2

(12) United States Patent
Quon et al.

(10) Patent No.: US 7,482,757 B2
(45) Date of Patent: Jan. 27, 2009

(54) INDUCTIVELY COUPLED HIGH-DENSITY PLASMA SOURCE

(75) Inventors: Bill H. Quon, Brea, CA (US); Jovan Jevtic, Milwaukee, WI (US); Sam Antley, Cottonwood, AZ (US); Eric J. Strang, Chandler, AZ (US)

(73) Assignee: Tokyo Electron Limited, Tokyo (JP)

( * ) Notice: Subject to any disclaimer, the term of this patent is extended or adjusted under 35 U.S.C. 154(b) by 646 days.

(21) Appl. No.: 10/472,553

(22) PCT Filed: Mar. 25, 2002

(86) PCT No.: PCT/US02/22080

§ 371 (c)(1),
(2), (4) Date: Feb. 17, 2004

(87) PCT Pub. No.: WO02/097937

PCT Pub. Date: Dec. 5, 2002

(65) Prior Publication Data

US 2005/0099133 A1     May 12, 2005

Related U.S. Application Data

(60) Provisional application No. 60/277,966, filed on Mar. 23, 2001, provisional application No. 60/277,965, filed on Mar. 23, 2001.

(51) Int. Cl.
*H01J 7/24* (2006.01)
(52) U.S. Cl. .............................. 315/111.21; 118/723 IR; 219/121.36
(58) Field of Classification Search ............... 118/723 I, 118/723 IR, 723 MA, 723 R; 315/111.21, 315/111.51, 111.01, 111.41, 111.71; 216/68; 156/345; 219/121.36, 121.41
See application file for complete search history.

(56) References Cited

U.S. PATENT DOCUMENTS 5,587,038 A     12/1996     Cecchi et al. .............. 118/723 I (Continued)

FOREIGN PATENT DOCUMENTS

JP     10-098033     4/1998

(Continued)

*Primary Examiner*—Douglas W Owens
*Assistant Examiner*—Jimmy T Vu
(74) *Attorney, Agent, or Firm*—Oblon, Spivak, McClelland, Maier & Neustadt, P.C.

(57) ABSTRACT

A high-density plasma source (100) is disclosed. The source includes an annular insulating body (300) with an annular cavity (316) formed within. An inductor coil (340) serving as an antenna is arranged within the annular cavity and is operable to generate a first magnetic field within a plasma duct (60) interior region (72) and inductively couple to the plasma when the annular body is arranged to surround a portion of the plasma duct. A grounded conductive housing (400) surrounds the annular insulating body. An electrostatic shield (360) is arranged adjacent the inner surface of the insulating body and is grounded to the conductive housing. Upper and lower magnet rings (422 and 424) are preferably arranged adjacent the upper and lower surfaces of the annular insulating body outside of the conductive housing. A T-match network is in electrical communication with said inductor coil and is adapted to provide for efficient transfer of RF power from an RF power source to the plasma. At least one plasma source can be used to form a high-density plasma suitable for plasma processing of a workpiece residing in a plasma chamber in communication with the at least one source.

36 Claims, 14 Drawing Sheets

U.S. PATENT DOCUMENTS

| | | | | |
|---|---|---|---|---|
| 5,589,737 | A * | 12/1996 | Barnes et al. | 315/111.21 |
| 5,681,418 | A * | 10/1997 | Ishimaru | 156/345.37 |
| 5,965,034 | A * | 10/1999 | Vinogradov et al. | 216/68 |
| 5,980,687 | A * | 11/1999 | Koshimizu | 156/345.29 |
| 6,238,533 | B1 * | 5/2001 | Satitpunwaycha et al. | 204/298.25 |
| 6,310,755 | B1 | 10/2001 | Kholodenko et al. | 315/111.51 |
| 6,423,192 | B1 * | 7/2002 | Wada et al. | 204/192.12 |
| 6,499,424 | B2 * | 12/2002 | Kazumi et al. | 118/723 R |
| 6,552,295 | B2 * | 4/2003 | Markunas et al. | 219/121.36 |
| 6,568,346 | B2 * | 5/2003 | Pu et al. | 118/723 I |
| 6,815,899 | B2 * | 11/2004 | Choi | 315/111.21 |
| 6,835,279 | B2 * | 12/2004 | Li et al. | 156/345.46 |
| 6,853,141 | B2 * | 2/2005 | Hoffman et al. | 315/111.21 |
| 7,098,599 | B2 * | 8/2006 | Miyake et al. | 315/111.21 |

FOREIGN PATENT DOCUMENTS

| | | |
|---|---|---|
| JP | 11-026192 | 1/1999 |
| JP | 11-162697 | 6/1999 |
| JP | 2000-208298 | 7/2000 |
| WO | WO 98-04844 | 10/1998 |

* cited by examiner

INDUCTIVELY COUPLED HIGH-DENSITY PLASMA SOURCE

CROSS-REFERENCE TO RELATED APPLICATIONS

This application claims priority to U.S. Application Ser. No. 60/277,966, filed on Mar. 23, 2001 and U.S. Application Ser. No. 60/277,965, filed on Mar. 23, 2001. The contents of those applications are incorporated herein by reference.

BACKGROUND OF THE INVENTION

1. Field of the Invention

The present invention relates generally to plasma processing systems and methods, and in particular relates to inductively coupled high-density plasma sources suitable for use in a plasma processing system.

2. Background of the Invention

Ionized gas or "plasma" may be used during processing and fabrication of semiconductor devices, flat panel displays and other products requiring etching or deposition ("plasma processing") of materials. Plasma may be used to etch or remove material from semiconductor integrated circuit wafers, or sputter or deposit material onto a semiconducting, conducting or insulating surface. Creating a plasma for use in manufacturing or fabrication processes typically is done by introducing a low-pressure process gas into a chamber surrounding a workpiece, such as an integrated circuit (IC) wafer, that resides on a workpiece support member, more commonly referred to as a "chuck." The molecules of the low-pressure gas in the chamber are ionized into a plasma by a plasma source after the gas molecules enter the chamber. The plasma then flows over and interacts with the workpiece, which may be biased by providing RF power to the chuck supporting the workpiece.

To be most effective in plasma processing, the plasma preferably has a high-density (measured as the number of electrons or ions per cubic centimeter) and is uniform. High-density plasma processing can increase throughput and therefore increase production in semiconductor manufacturing. Furthermore, the plasma preferably has a small volume (thin and flat) so that the radicals in the process system have a short residence time. A short radical residence time permits control of the proper dissociation of radicals in the plasma volume for achieving high rate, selective etch in high aspect ratio etch features.

One type of plasma source that has been developed and commonly used is a parallel-plate, capacitively coupled plasma (CCP) source. Such a source uses radio-frequency (RF) power sources to generate the plasma through gas discharge. These power sources typically operate at 13.56 MHz, but can operate at other frequencies. Parallel-plate plasma sources usually have small gap spacing and small plasma volume. However, they typically generate low-density plasmas of less than $10^{11}$ ions/cc which limits the etch rate.

Another type of plasma source is an electron cyclotron resonance ("ECR") source, which uses microwave (2.45 GHz) energy sources to generate a plasma having relatively high densities, on the order of $10^{11}$-$10^{12}$ ions/cc and greater. Although an ECR source provides a relatively high plasma density and good control of ion energy, it requires in the plasma source a significant magnetic field, which is normally undesirable in the processing reactor. In addition, difficulties arise in generating uniform plasmas over large wafer areas.

A third type of plasma source is an inductively coupled plasma (ICP) source, which uses an inductively coupled radio-frequency power to generate the plasma This type of plasma source provides for a relatively high plasma density ($10^{12}$ ions/cc or greater) and operates with a radio-frequency source (typically 13.56 MHz). However, a shortcoming of conventional inductively coupled plasma sources is a non-uniform plasma density in the region above the substrate. The plasma volume is also very large, resulting in very long residence times for the radicals, which limits the etch rate.

A fourth type of plasma source is the Helicon plasma source, which uses a relatively constant volume magnetic field. It is capable of generating a very high density ($10^{13}$ ions/cc) and operates with a radio-frequency source (typically 2-30 MHz). The Helicon source requires propagation and damping of the low frequency whistler wave in a system with minimum length greater then one half of the propagating wavelength. In short systems, the plasma generating efficiency is usually reduced drastically.

For those prior art systems capable of producing a high-density plasma (in excess of $10^{12}$ ions/cc), efficiency is generally sacrificed in producing plasma in a small volume. This inefficiency makes high-density plasma processing a costly proposition for manufacturing purposes.

BRIEF SUMMARY OF THE INVENTION

The present invention relates generally to plasma processing systems and methods, and in particular relates to an inductively coupled high-density plasma source suitable for use in a plasma processing system.

A first aspect of the present invention is a high-density plasma source that includes an annular insulating body having an upper surface, a lower surface, a cylindrical inner surface and a first central axis. An annular cavity is formed within the insulating body having a second central axis that coincides with the first central axis. A single inductor coil that serves as an antenna is arranged within the annular cavity and is operable to generate a first magnetic field within a plasma duct interior region and inductively couple to the plasma formed therein when the annular body is arranged around a portion of the plasma duct. A grounded conductive housing surrounds the annular insulating body, and an electrostatic shield is arranged adjacent the insulating body inner surface and is grounded to the conductive housing. A T-match network is in electrical communication with the inductor coil. The T-match network includes first and second variable capacitors that are tunable to provide for efficient transfer of RF power from the inductor coil antenna to the plasma.

In a second aspect of the present invention, the above-described plasma source includes a first plurality of spaced apart magnets arranged in a first concentric magnet ring adjacent the insulating body upper surface, and a second plurality of spaced apart magnets arranged in a second concentric magnet ring adjacent the insulating body lower surface.

A third aspect of the invention is a plasma reactor system for processing a workpiece. The system comprises a plasma reactor chamber having a central axis, an upper wall and sidewalls surrounding a first interior region capable of supporting a plasma. At least one plasma duct is attached to the upper wall and/or to the sidewall of the reactor chamber. The plasma ducts each have duct sidewalls that enclose second interior regions that are in communication with the plasma reactor chamber interior region. Plasma sources, as described briefly immediately above and in more detail below, surround a portion of each plasma duct, and define plasma generation regions within each second region. A chuck is arranged opposite the upper wall and supports a workpiece to be processed.

A fourth aspect of the invention is a method of forming a high-density plasma in an interior region of a plasma chamber. The method includes the steps of injecting plasma gas into a plasma generation region of a plasma duct that is in communication with the chamber interior region. The next step involves providing RF power through a T-match network to a single annular inductor coil surrounding the plasma generation region, thereby generating a first magnetic field within the plasma generation region. The next step includes measuring an amount of reflected power reflected from the inductor coil passing back through the T-match network. The last step involves adjusting the capacitance of the T-match network so as to minimize the amount of reflected power.

As the plasma uniformity requirements are more critical for still larger wafer size, it is desirable to use a plurality of smaller plasma sources, with individual plasma density control to form a high-density plasma uniformly distributed over a large region above the substrate.

DETAILED DESCRIPTION OF THE PREFERRED EMBODIMENTS

The present invention relates generally to plasma processing systems and methods, and in particular relates to inductively coupled high-density plasma sources suitable for use in a plasma processing system.

Figure 1A:
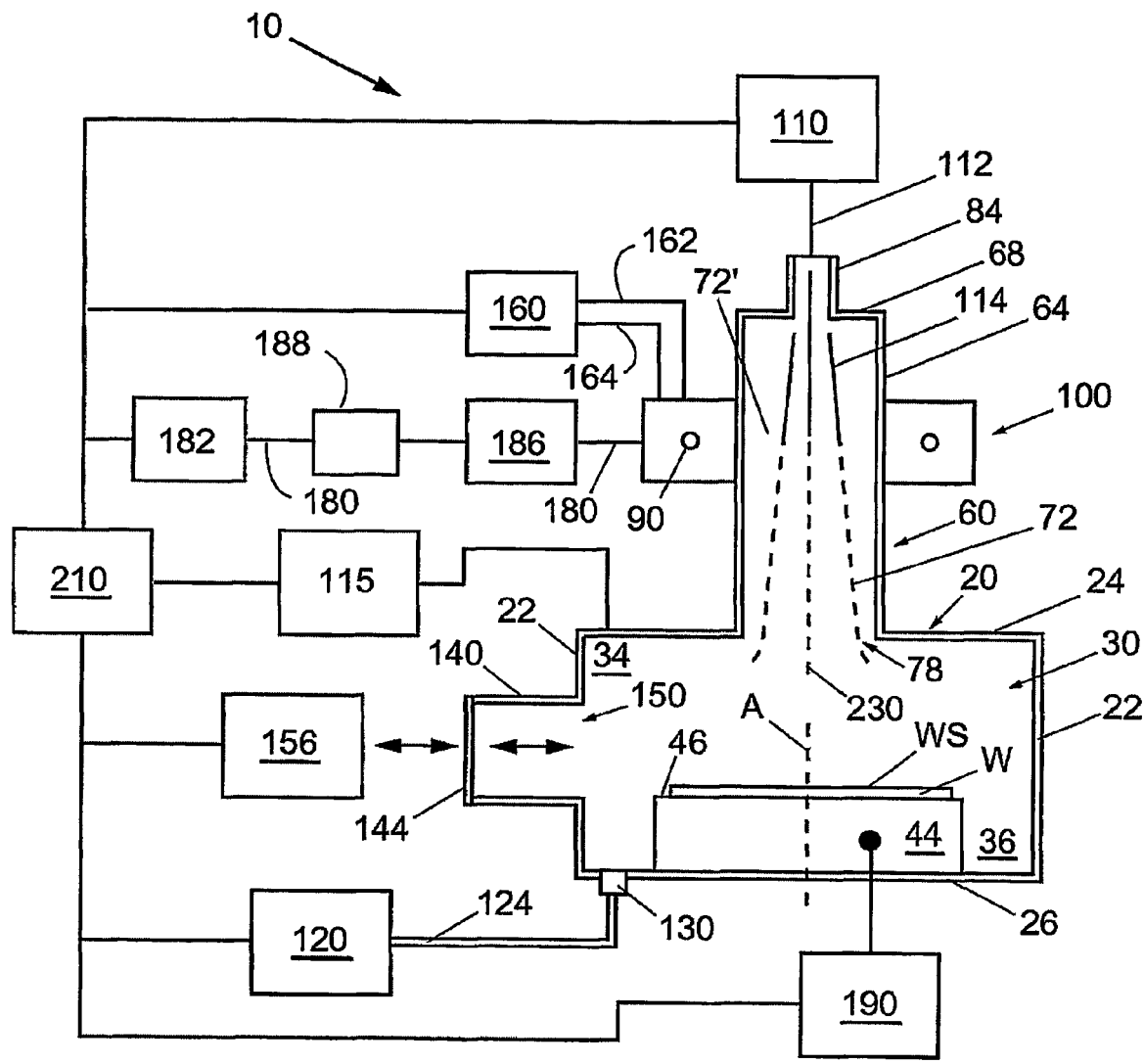
FIG. 1A is a schematic cross-sectional diagram of a plasma reactor system with a single plasma source of the present invention.

With reference now to FIG. 1A, there is shown a plasma reactor system 10 that includes a reactor chamber 20 having an outer wall 22, an upper wall 24 and a lower wall 26 that enclose an interior region 30. Interior region 30 includes an upper interior region 34 closest to the upper wall, and a lower interior region 36 adjacent the upper region. Chamber 20 may be constructed of various materials, including stainless steel, aluminum, metal alloys, or various ceramics. The use of stainless steel or aluminum allows for effective chamber cooling and can reduce reactions between the plasma and the plasma chamber. The use of ceramic materials reduces dissipation of radio-frequency electromagnetic waves into walls 22 of plasma chamber 24. Considerations of the particular application of system 10 dictates which material is best suited for that application. A preferred embodiment of the present invention employs a cylindrical metallic chamber with a central axis A.

Residing in interior region 30 adjacent lower wall 26 is a workpiece holder or "chuck" 44 having an upper surface 46 capable of supporting a workpiece W to be plasma processed. Workpiece W has an upper surface WS. The size of chamber 20 depends on the size of the particular workpieces W to be processed, as the chamber must be large enough so that the plasma generated will cover the entire portion of the workpiece. For example, if workpiece W is an eight-inch semiconductor wafer, the plasma generated within chamber 20 must have a large enough diameter (e.g. over 6 inches) to uniformly cover the full diameter of the semiconductor wafer.

Attached to upper wall 24 of chamber 20 and aligned with central axis A is a cylindrical duct 60 having an outer wall 64 and an upper wall 68 enclosing an interior region 72. The latter is in communication with interior region 30 via an aperture 78 formed in plasma chamber upper wall 24. Plasma duct upper wall 68 includes a gas inlet port 84 to which can be connected a gas source. Plasma duct 60 is preferably quartz (e.g., a quartz tube) or similar non-reactive material, such as glass or a ceramic material such as sapphire, or alumina, suitable for serving as a conduit for plasma to enter interior region 30 of chamber 20. Surrounding a portion of plasma duct 60 is electrostatically shielded radio frequency (ESRF) antenna 90, discussed in greater detail below. Duct 60 and ESRF antenna 90 constitute part of a plasma source 100 of the present invention, discussed in greater detail below.

With continuing reference to FIG. 1, system 10 further includes a gas source 110 in pneumatic communication with interior region 72 via a gas line 112 connected to gas inlet port 84, for providing a gas 114 into the plasma duct interior region. Gas source 110 may provide an ionizable carrier gas, such as Argon, capable of being formed into a suitable plasma. A reactive process gas, such as Oxygen, $CF_4$, HBr, and Cl, may be injected to the reactor chamber via a gas distribution system 115 in pneumatic communication with chamber interior region 30. Addition of process gas directly to interior region 30 of process chamber 20 through gas distribution system 115 (rather than through plasma duct 60) can lead to a reduced degree of dissociation, generally preferred for oxide etch applications. However, for other chemistries, a more highly dissociated process gas may be desirable. In such cases, gas distribution system can be in pneumatic communication with interior region 72 of duct 60. The particular gas used depends on the material (e.g., polysilicon, copper, aluminum or silicon dioxide) making up workpiece surface WS to be processed.

System 10 also includes a vacuum system 120 in pneumatic communication with chamber interior region 30 via a vacuum line 124 connected to a vacuum port 130 located in lower wall 26. A vacuum can be drawn by a variety of vacuum systems, the particular system depending on the desired pressure in interior region 30. In a preferred embodiment of the present invention, vacuum system 120 includes a turbomolecular pump and an electro-mechanical gate valve (not shown) between the pump and chamber 20 that is capable of being remotely operated via an electrical signal from a controller. Vacuum system 120 and gas supply system 110 together are capable of reducing the pressure in chamber 20 to within the range of approximately 1 mTorr to 1 Torr, depending on the application.

System 10 further includes a workpiece load chamber 140 having a sealable door 144, attached to plasma chamber 20 near chuck 44. Chamber 140 is in communication with interior region 30 through an aperture 150 in wall 22. Door 144 is sized to allow a workpiece W to be placed into workpiece load chamber 140. Also included is a workpiece handling system 156 in operable communication with load chamber 140 and chuck 144 for transporting workpieces W to and from the chuck through the load chamber.

Also included in system 10 is a cooling system 160 fluidly connected, via cooling in-line 162 and cooling out-line 164, to the plasma source 100, for cooling the plasma source during the plasma generation process. Cooling system 160 is discussed in greater detail below.

Also connected to the plasma source 100 via a power line 180 is a RF power supply 182 for providing RF power to the plasma source. A match network 186 is provided between RF power supply 182 and ESRF antenna 90 for providing an impedance match to the plasma, as described further below. A power meter 188 capable of measuring forward and reflected power is arranged between RF power supply 182 and match network 186, for measuring the amount of RF power provided to and reflected from plasma source 100.

System 10 may also include a chuck RF power source 190 in electrical communication with chuck 44 for biasing the chuck so that ionized gas may be drawn toward workpiece W during plasma processing.

System 10 further includes a main control system 210 electrically connected to chuck RF power supply 190, plasma source RF power supply 182, cooling system 160, workpiece handling system 156, vacuum system 120, gas supply system 110 and gas distribution system 115. Control system 210 controls and coordinates the operation of the above-mentioned systems through respective electrical signals.

With continuing reference to FIG. 1A, system 10 operates as follows. Control system 210 initiates the placement of workpiece W onto upper surface 46 of chuck 44 through load chamber 140 via workpiece handling system 156. Control system 210 then activates vacuum system 120 to pump down interior region 30 of chamber 20. Once the pressure of interior region 30 is reduced to a certain level (e.g., $10^{-8}$ to $10^{-4}$ Torr), control system 210 initiates the flow of gas from gas supply system 110 and/or gas distribution system 115 into interior region 72 of plasma source 100 and/or interior region 30 of chamber 20. At about the same time, control system 210 activates RF power supply 182 to activate ESRF antenna 90. As gas 114 flows through interior region 72, the gas is ionized, thereby forming a plasma gas ("plasma") 230. The portion of interior region 72 wherein plasma 230 is formed is called the plasma generation region, and is denoted by 72'. Reactive species of the process gases are formed in interior region 30 of reactor chamber 20 by dissociation of the process gases in the expanding plasma. Control system 210 then optionally activates chuck RF power supply 190 to bias chuck 44. Plasma 230 flows toward workpiece W via diffusion, and interacts with upper surface WS workpiece. Spent plasma 230 and other gaseous products produced during plasma processing are ultimately exhausted from interior region 30 by vacuum system 120.

Figure 1B:
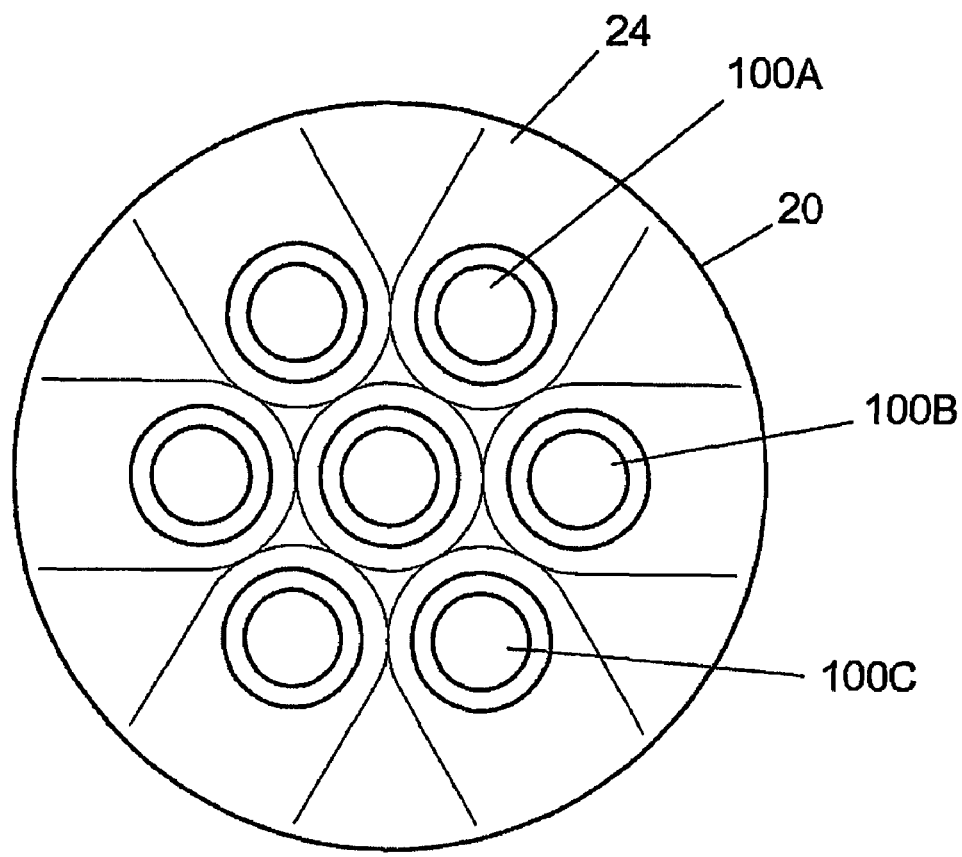
FIG. 1B is plan view of a plasma reactor system with multiple plasma sources of the present invention arranged in a disk configuration atop the plasma chamber.
Figure 1C:
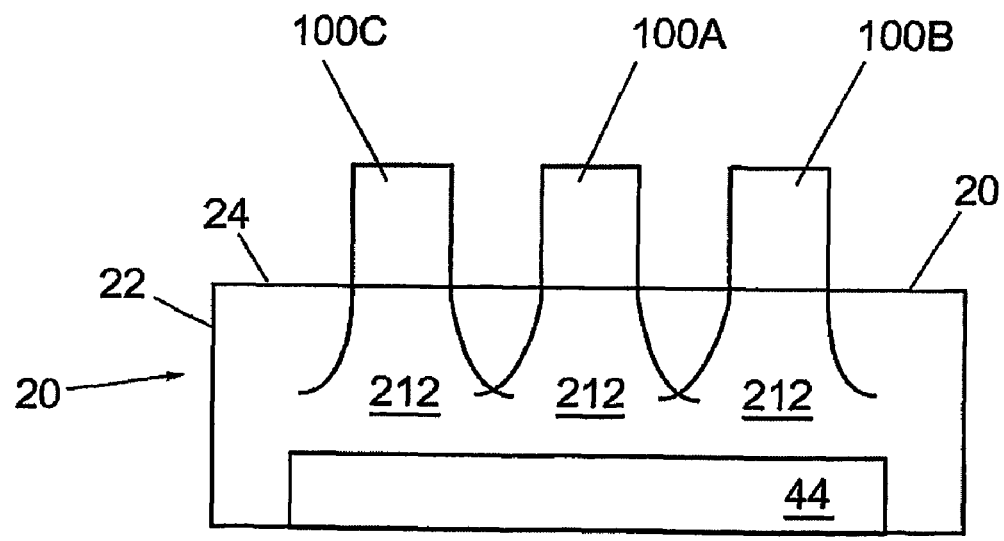
FIG. 1C is a schematic cross-sectional diagram of a plasma reactor system of FIG. 1B, showing the flow of plasma toward the chuck.
Figure 1D:
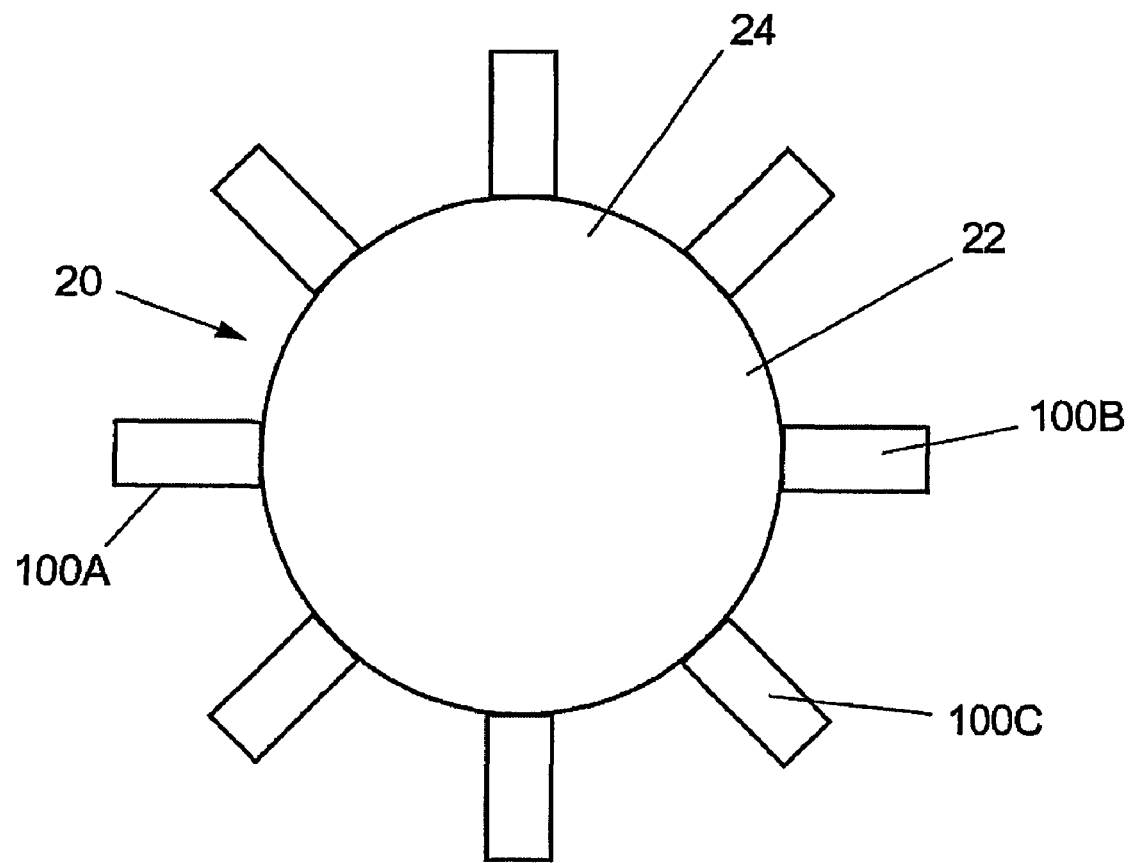
FIG. 1D is a plan view of a plasma reactor with multiple plasma sources of the present invention arranged in a ring configuration surrounding the reactor chamber, showing the flow of plasma toward the chuck.
Figure 1E:
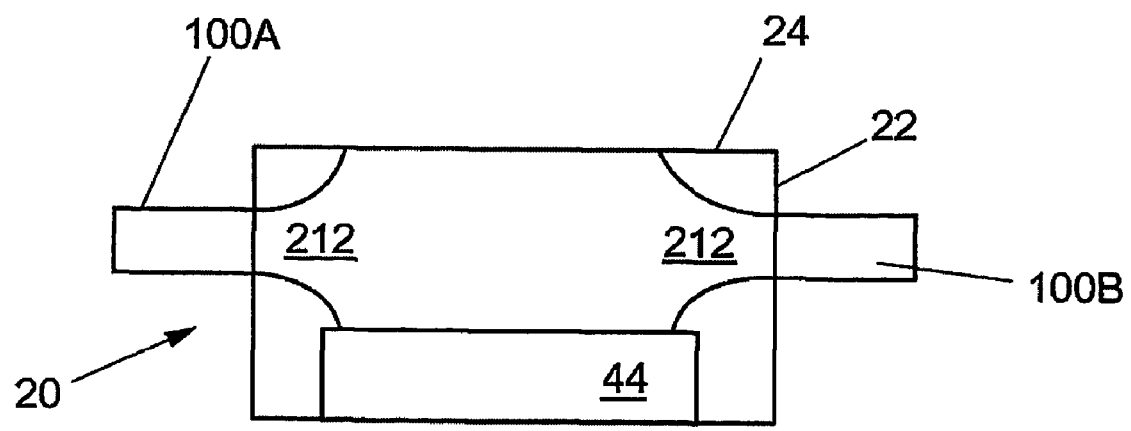
FIG. 1E is a schematic cross-sectional diagram of the plasma reactor system of FIG. ID.

The uniformity of the expanding plasma in the region of workpiece W is often limited to the workpiece's central region for larger workpieces. Accordingly, as shown in FIGS. 1B and 1D for a large workpiece, multiple plasma sources (100A, 100B, ... 100N) may replace the single plasma source of FIG. 1A. In the embodiment of FIG. 1B, the plasma sources are arranged in a disk configuration on upper wall 24 may be used to generate a uniform plasma 212 (as shown in FIG. 1C) near the surface of the workpiece. Alternatively, for CVD or PECVD reactors in which the top surface area (e.g., upper wall 24 of chamber 20; see FIG. 1A) is not available, the multiple compact sources (100A, 100B, ... 100N) can be arranged in the cylindrical wall (e.g., outer wall 22 of chamber 20) in a ring configuration, as shown in FIGS. 1D and 1E. In both configurations, each individual plasma source 100A, 100B, ... 100N has its own gas feed line 112, RF power generator 182 and match network system 186 for full control of the plasma density and chemistry.

The Compact Plasma Source

Figure 2:
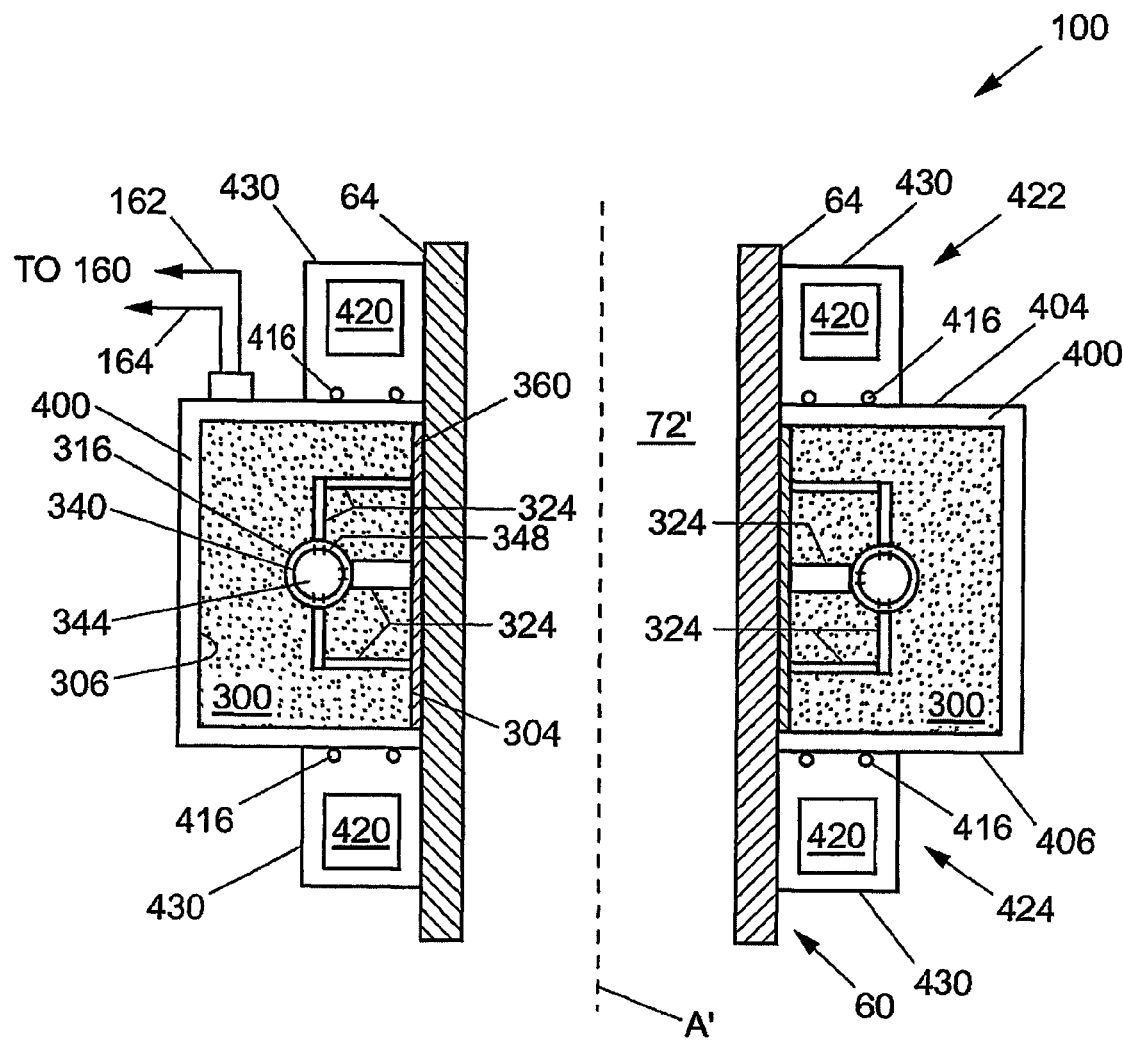
FIG. 2 is a cross-sectional schematic diagram of the plasma source of the present invention showing the upper and lower magnet rings enclosed in separate housings.

With reference now to FIG. 2, compact plasma source 100 of the present invention is now described in greater detail.

Plasma source 100 comprises an annular block 300 of insulating material having an inner surface 304, an outer surface 306 and an axis of rotation A' that is aligned with central axis A of chamber 20 when the plasma source is incorporated into system 10. Annular block 300 is preferably made of TEFLON® or like non-conducting material, and is preferably formed from two separate blocks that are pieced together in the middle. Within block 300 is formed an annular inductor coil channel 316 having A' as its axis of rotation. Further included within block 300 are one or more coolant channels 324 connected to inductor coil channel 316 and that extend toward axis A'.

Arranged within inductor coil channel 316 and mechanically constrained therein is an inductor coil 340 that constitutes a single loop antenna, identified above in FIG. 1A as ESRF antenna 90. Inductor coil 340 is made from conducting material, and is preferably copper. Inductor coil 340 is in the form of a tube having an interior 344 through which a dielectric cooling fluid, such as FLOURINERT®, can flow. Coil 340 includes apertures 348 incrementally positioned along its length so as to provide fluid communication between coolant system 160, coil 340 and coolant channels 324. Coil 340 is electrically connected to match network 186 and plasma source RF power supply 182 via power line 180 (FIG. 1A). As described below, coolant lines 162 and 164 connect coolant system 160 to inductor coil 340.

Figure 3:
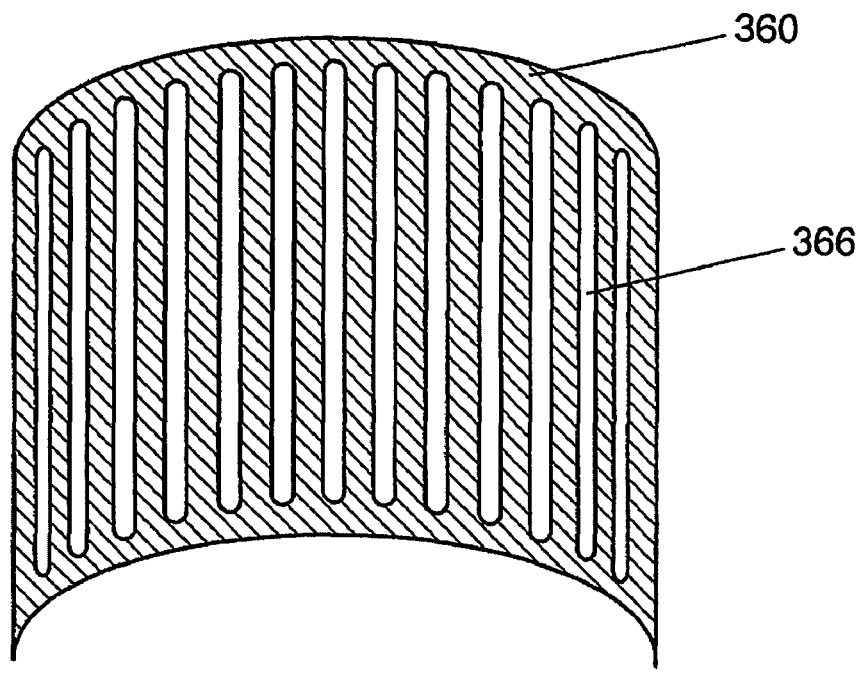
FIG. 3 is a perspective view of a portion of the cylindrical electrostatic shield used in the plasma source of FIG. 2.

With reference now also to FIG. 3, arranged adjacent interior surface 304 is an electrostatic shield 360 (also referred to as an E-shield or Faraday shield) comprising an electrically grounded, cylindrical conductive sheet with slots 366 aligned parallel with axis A' (i.e., in the vertical or y-direction). Slots 366 may either be fixedly spaced (e.g., at equal distances) or may be spaced apart using a slideable grouping of shields. (One embodiment of slideable shields is disclosed in PCT/US98/21623, which is incorporated herein by reference in its entirety.) With reference again to FIG. 2, electrostatic shield 360 serves to minimize capacitive coupling between inductor coil 340 and plasma 230 formed within plasma generation region 72' by limiting the area through which the electromagnetic field from the coil can couple to the plasma. The role of an electrostatic shield as part of a plasma source is discussed in U.S. Pat. No. 5,234,529, which patent is incorporated by reference herein. When plasma source 100 is in place around plasma duct 60, electrostatic shield 360 resides between interior surface 304 of block 300 and wall 64 of the plasma duct. It is preferred that sufficient space (not shown) be provided between inner surface 304 and wall 64 so that cooling fluid can flow over electrostatic shield 360 and wall 64 to cool the portion of plasma duct 60 surrounded by plasma source 100.

Plasma source 100 further includes a housing 400 having an upper surface 404 and a lower surface 406 that surrounds block 300. Housing 400 is preferably made of a conductor, such as metal (e.g., copper), so that the housing can be grounded. Electrostatic shield 360 is electrically connected to housing 400 at its upper and lower edges so that the electrostatic shield is also grounded. Housing 400 may include seals 416 (e.g., O-rings) on upper surface 404 and/or lower surface 406 so that other apparatus can be mounted to the housing in a sealed manner.

The Magnets for the Plasma Source

Figure 4:
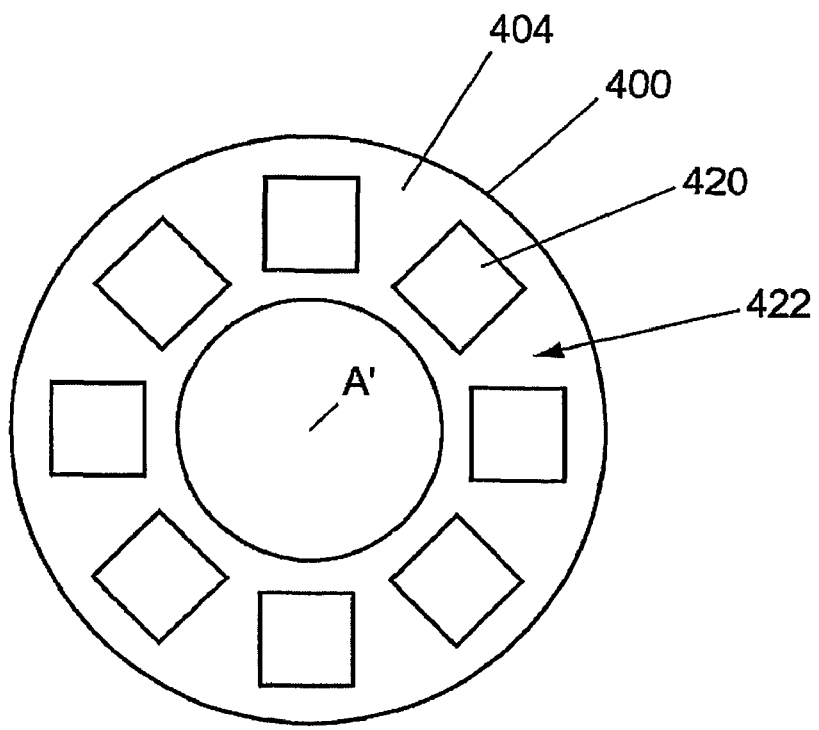
FIG. 4 is a plan view of the plasma source of FIG. 2 with the upper magnet housing removed to illustrate the annular arrangement of the magnets making up the upper magnet ring.

With reference now also to FIG. 4, plasma source 100 also optionally includes a plurality of magnets 420 arranged adjacent upper surface 404 and/or lower surface 406. Magnets 420 are preferably permanent (i.e., fixed or "DC" field) and in the form of blocks arranged in annular ring fashion above and below inductor coil channel 316, thus forming an upper magnet ring 422 and a lower magnet ring 424, respectively. Magnets 420 may alternatively be electromagnets. In FIG. 4, upper magnet ring 422 is shown as having eight magnets. In an exemplary embodiment, plasma source 100 includes between 16 and 24 magnets between upper magnet ring 422 and lower magnet ring 424. Such magnets may be evenly or spaced varying separations therebetween. Magnets 420 may be included within housing 400, or may be housed in a separate sealed housing 430, as shown in FIG. 2. The role of magnets 420 is to create a local magnetic field adjacent plasma generation region 72' that affects the behavior of plasma 230 to achieve a desired result (e.g., increased efficiency, a high plasma density or a preferred plasma flow direction). Magnets 420 are typically required as part of plasma source 100 to generate a plasma density of $10^{13}$ ions/cc or higher, and generally increase the plasma density by about a factor of 3× as compared to when magnets are not used. The plasma density increase is a result of magnetic confinement for the energetic electrons in the tail of the electron energy distribution function (EEDF), which are responsible for ionization of the neutral gas.

Figure 5A:
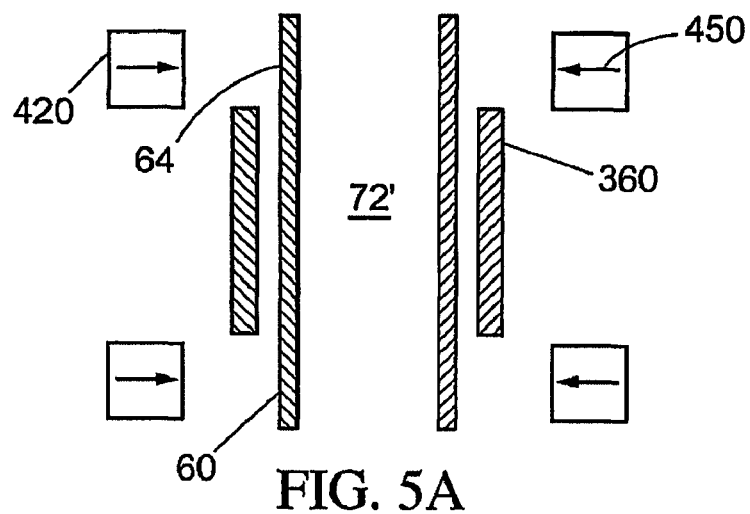
FIGS. 5A-5C are close-up cross-sectional diagrams of the plasma source of FIG. 2 showing just the plasma duct wall, the electrostatic shield, and the magnets in the upper and lower magnet rings, illustrating the three different magnet configurations.
Figure 5B:
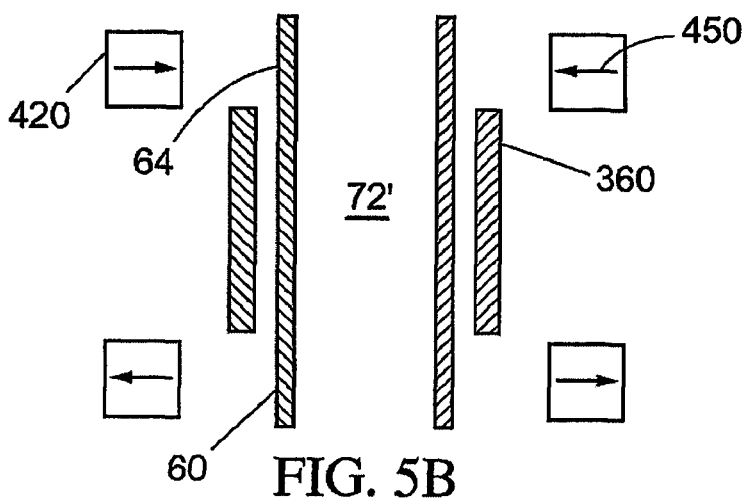
Figure 5C:
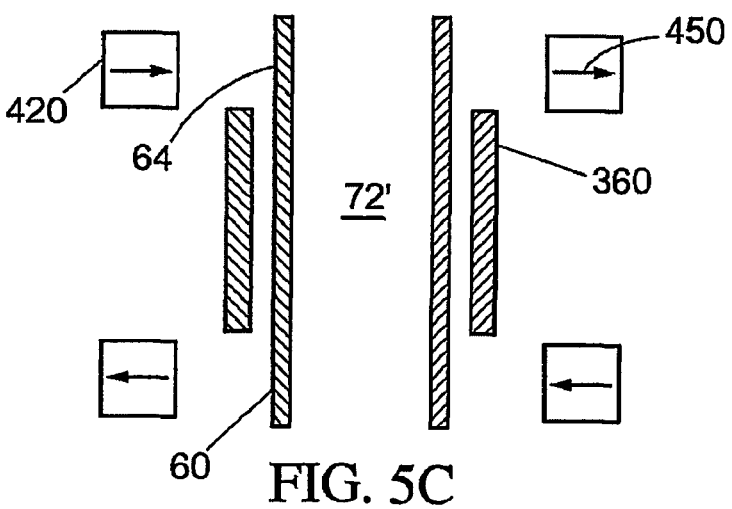
Figure 5D:
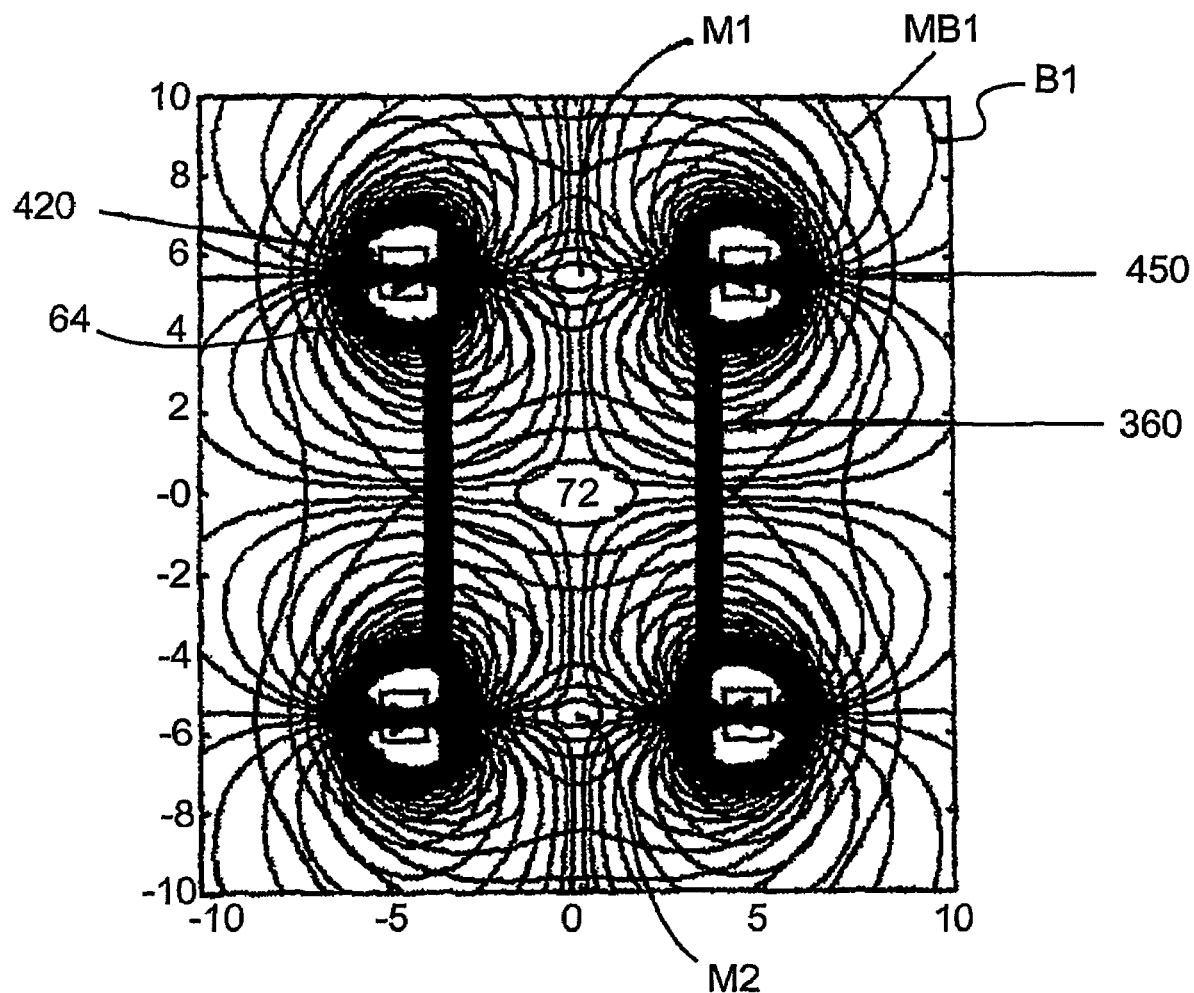
FIGS. 5D-5F illustrate the magnetic fields corresponding to the magnet configurations of FIGS. 5A-5C, respectively.
Figure 5E:
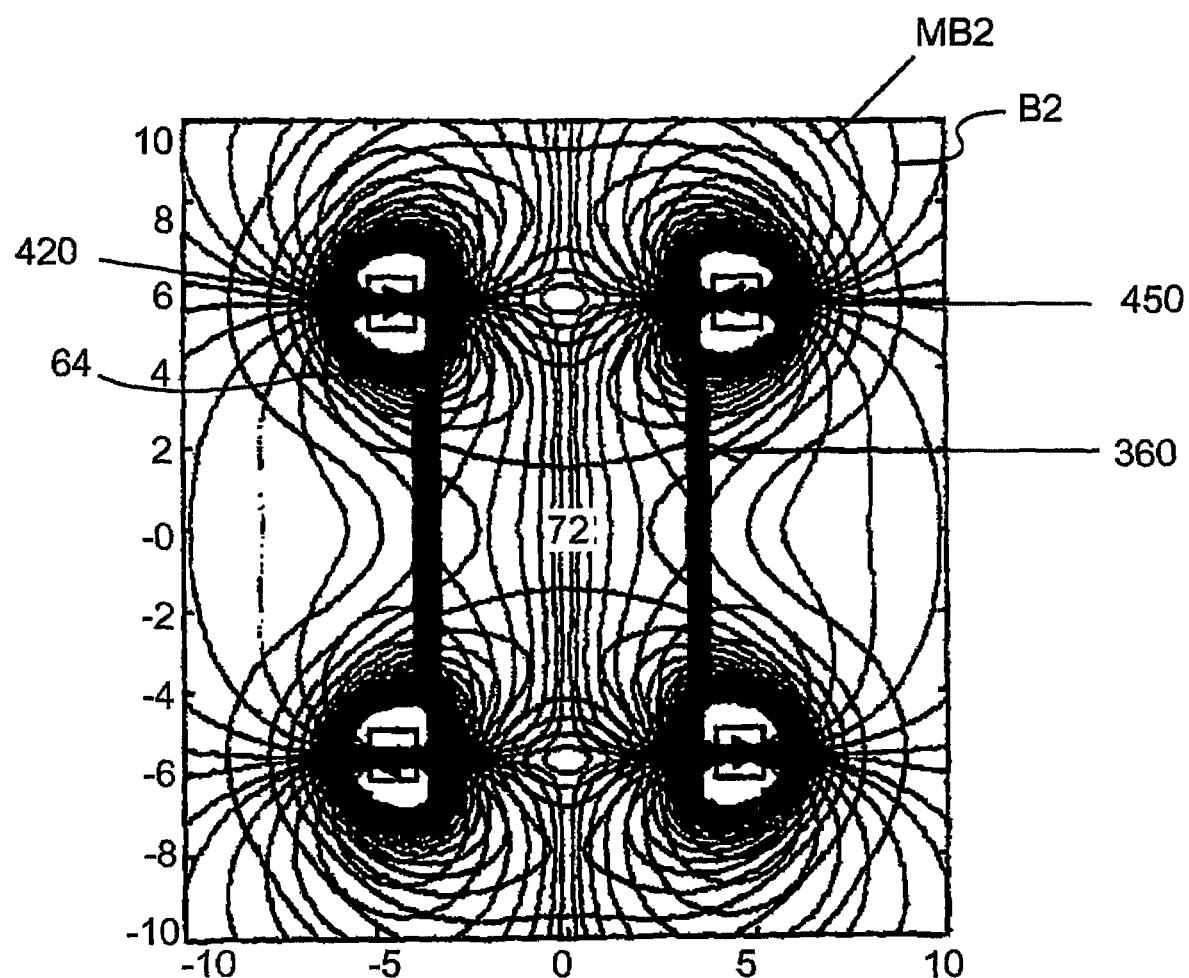
Figure 5F:
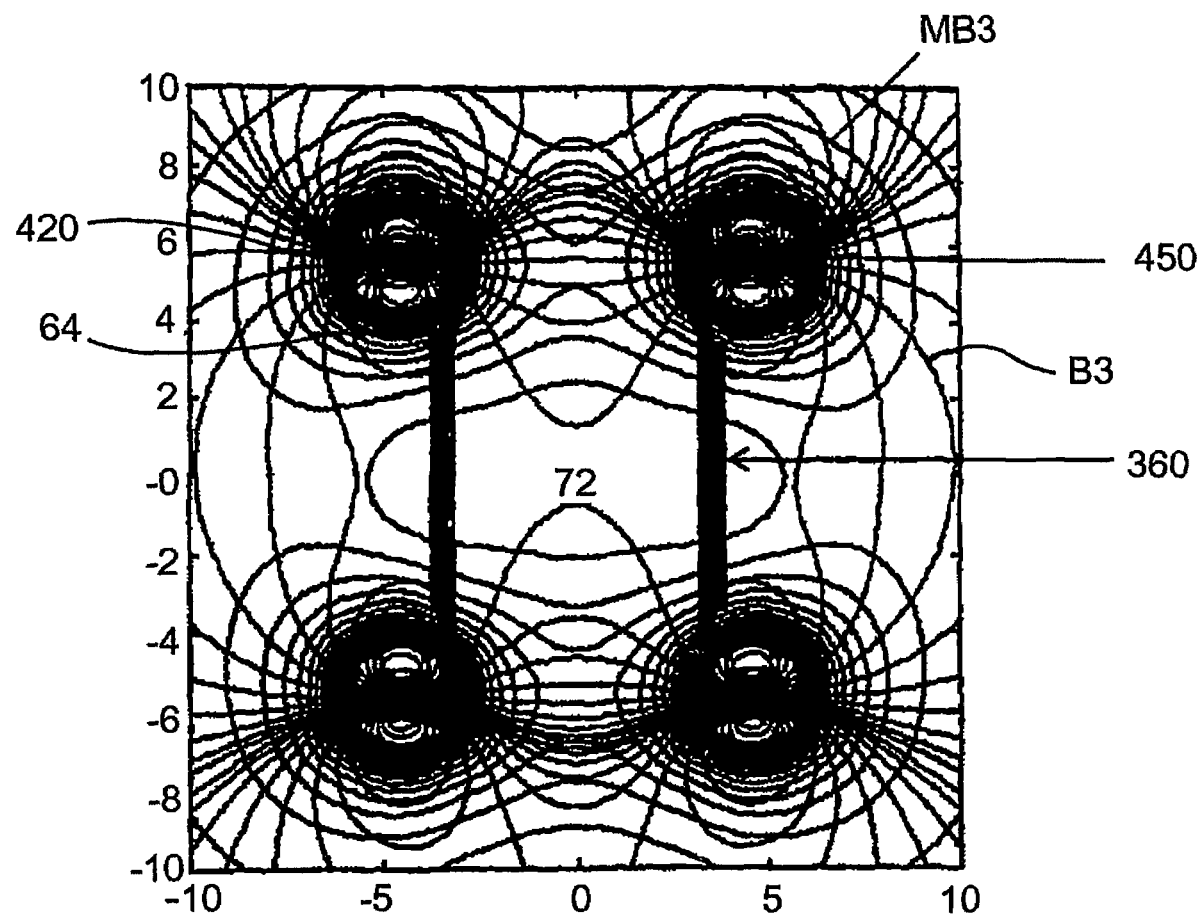

With reference now to FIGS. 5A-5C, there are shown three different magnetic configurations for magnets 420, with the magnetic orientation given by arrow 450 (the arrowhead represents the magnet's north pole). The magnetic field lines for the three configurations illustrated in FIGS. 5A-5C are indicated in FIGS. 5D-5F, respectively. The modulus contours of the magnetic field (mod-B) are indicated by contour lines MB1, MB2, and MB3, respectively. Note that magnetic field lines B1, B2, and B3 are relatively localized, having their greatest strength at the respective margins of plasma generation region 72'.

With reference to FIGS. 5A and 5D, there is shown what is called the ring-cusp configuration, wherein all magnets 420 in the upper and lower magnet rings 422 and 424 are oriented such that their north pole is directed radially inwards. The field lines B1 in FIG. 5D represent a ring-cusp magnetic field topology. There is a minimum-field region in the mid-plane near the axis of the plasma duct, encircled by the nested close mod-B contour lines. The so-called minimum-B configuration provides a stable magnetic confinement for the plasma Such a configuration provides for the highest plasma density (on the order of $10^{13}$ ions/cc or greater). However, in a ring-cusp configuration, magnetic field lines BI are such that the plasma ions (e.g., plasma 230 of FIG. 1A) are not tightly confined and tend to interact with wall 64 of plasma duct 60. This can result in material being sputtered from wall 64. A typical ring-cusp configuration produces a magnetic field strength of approximately 50 Gauss near the region of the ESRF antenna. Notice that there are two secondary minimum-B regions M1 and M2 shown in FIG. 5D; one near the top magnet array (M1) and one near the bottom magnet array (M2). These local minima also help create a high density plasma in the plasma duct.

With reference now to FIGS. 5B and 5E, there is shown what is called the mirror-field configuration, wherein the magnetic moments of all of magnets 420 in upper magnet ring 422 are oriented with their north pole directed radially inwards, while all of the magnets in the lower magnet ring 424 are oriented with their north pole directed radially outwards. Of course, the magnet pole orientations of the respective magnet rings may be reversed to provide the same effect. The field lines B2 in FIG. 5E represent a magnetic mirror field topology. In the mirror-field configuration, magnetic field lines B2 have a significant longitudinal (i.e., axial) component. This serves to protect wall 64 of plasma duct 60 from sputtering. However, the plasma density in the mirror configuration is reduced by approximately 25% from that possible with the ring-cusp configuration of FIG. 5A. A typical mirror-field configuration produces a minimum magnetic field strength of approximately 300 Gauss. The local minimum-B regions in the mirror configuration are found to have the highest plasma density.

Figure 5G:
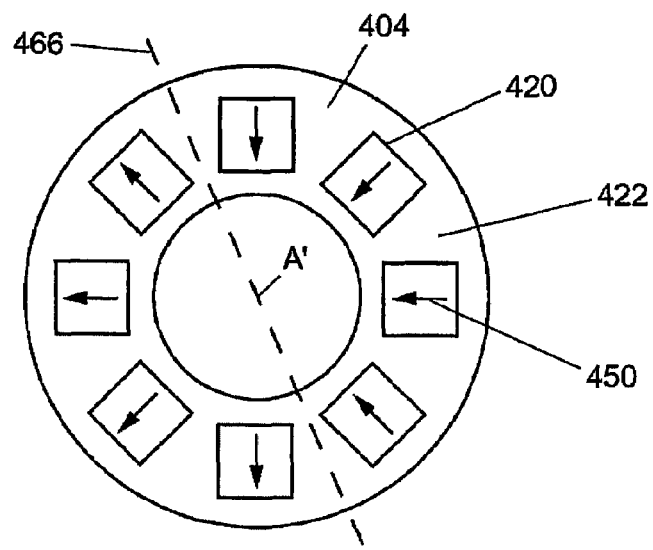
FIG. 5G is a plan view of the magnetic configuration of the upper magnet ring for the magnetic configuration shown in cross-section in FIG. 5C.

With reference now to FIGS. 5C, 5F and 5G, there is shown what is called the dipole configuration, wherein half of magnets 420 in each magnet ring 422 and 424 are oriented with their north poles directed radially inward, while the other (opposing) half of the magnets in the ring are oriented with north poles directed radially outward. Dashed line 466 in FIG. 5G represents the dividing line between the portions of ring 422 having the different magnetic orientations. In yet another embodiment, the magnets in any one ring may also be configured N, S, N, S, etc. with adjacent rings either being aligned such that a N magnet is above another N magnet, or such that an N magnet is above an S magnet. In either such alternative embodiment, the spacing between adjacent opposing magnets in the same ring is preferably increased as compared to rings where several like magnets are adjacent each other (e.g., see FIG. 5G).

The illustrated dipole configuration has magnetic field lines B3 that extend primarily across a transverse plane above and/or below plasma generation region 72'. Such a magnetic field orientation provides for electron confinement within plasma generation region 72', while not strongly confining the heavier ions to this region. The magnetic field orientation in upper magnet ring 422 results in magnetic field lines B3 that can isolate plasma generation region 72' from gas inflow from gas inlet port 84 or process reactor effluent inlet flow (not shown). Likewise, the magnetic field orientation in lower magnet ring 424 may be utilized to isolate plasma generation region 72' from components (i.e. vacuum pumps) downstream of the plasma generation region. Alternatively, both upper and lower magnet rings 422 and 424 may be utilized in combination to isolate plasma generation region 72' entirely. Electrons from plasma source region 72' can only diffuse (via electron-neutral collisions) into interior region 30 of reactor chamber 20 across magnetic field B3. Such magnetic isolation is desirable for controlling the plasma. Because the fast electrons (with energy in excess of 10-30 eV) are reflected by the local magnetic field, the diffused plasma includes only low energy electrons with a temperature of about 1 eV. This property can be used in forming large uniform plasma with controllable electron energy distribution function (EEDF).

The Match Network

In one embodiment of the plasma source of the present invention, a match network, as described below, is also included. (Such match network is preferable, but not required, for use with the plasma source of the present invention.). Accordingly, with reference now to FIG. 6A and also again to FIG. 1A, plasma source 100 is connected to a match network 186, which is in electrical communication with inductor coil (i.e., ESRF loop antenna) 340 via RF power line 180, and also to RF power supply 182. Power meter 188, arranged between RF power supply 182 and match network 186 measures the amount of power provided to and reflected from plasma source 100. Together, plasma source 100 and match network 186 form a plasma source 100'.

Match network 186 includes a first variable capacitor 500 electrically connected to RF power line 180 and to a first capacitor controller 502 that is used to vary the capacitance of the first variable capacitor 500. The first variable capacitor 500 is electrically connected to an inductor coil 340. Match network 186 further includes a second variable capacitor 506 electrically connected to a second capacitor controller 508 that is used to vary the capacitance of the second variable capacitor 500. The second variable capacitor 506 is electrically connected in parallel with inductor coil 340 and to the output node of the first variable capacitor 500, and has a grounded end 512. The topology of match network 186 is a so-called "T-match network," and is schematically illustrated in FIG. 7.

Figure 7:
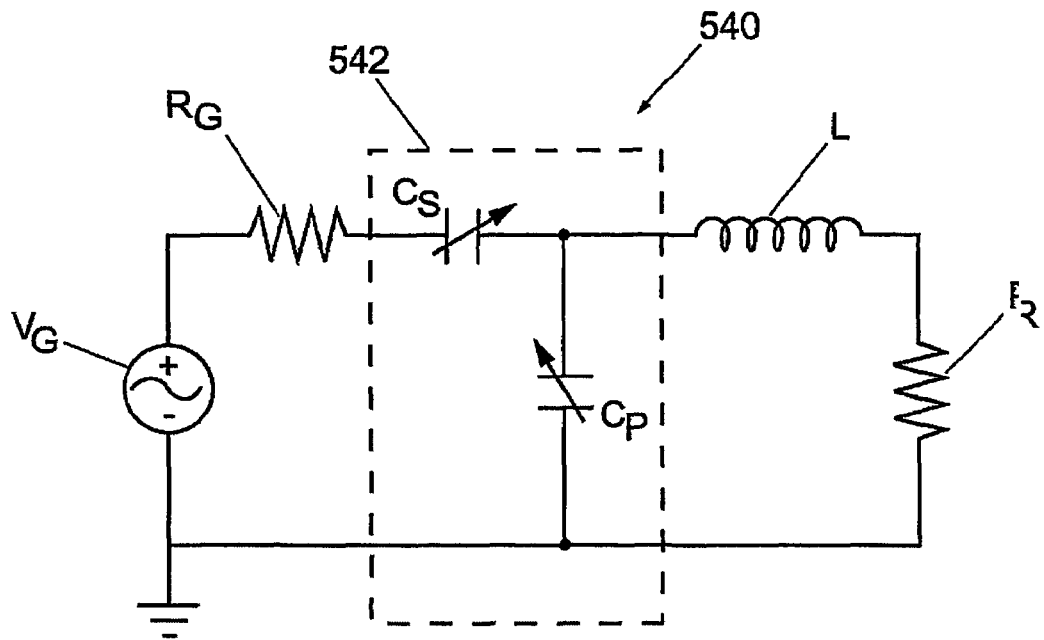
FIG. 7 is a schematic circuit diagram of the T-match network of the plasma source of FIGS. 6A, 6B and 6D.

In FIG. 7, T-match network circuit 540 comprises a voltage source $V_G$, which is plasma source RF power supply 182. Connected in series with voltage source $V_G$ is a resistor $R_G$, which represents the impedance of plasma source RF power supply 182. The "T" part of circuit 540, as indicated by the dashed box 542, includes an arrangement of first and second variable capacitors $C_S$ (S for "series") and $C_P$ (P for "parallel"), which correspond to first and second variable capacitors 500 and 502, respectively. Further included in circuit 540 are an inductor L and a resistor R, which represent the load impedance of inductor coil 340 (typically between 0.1 and 0.2 Ohms) as well as the impedance of plasma 230 created in plasma generation region 72'.

Figure 6A:
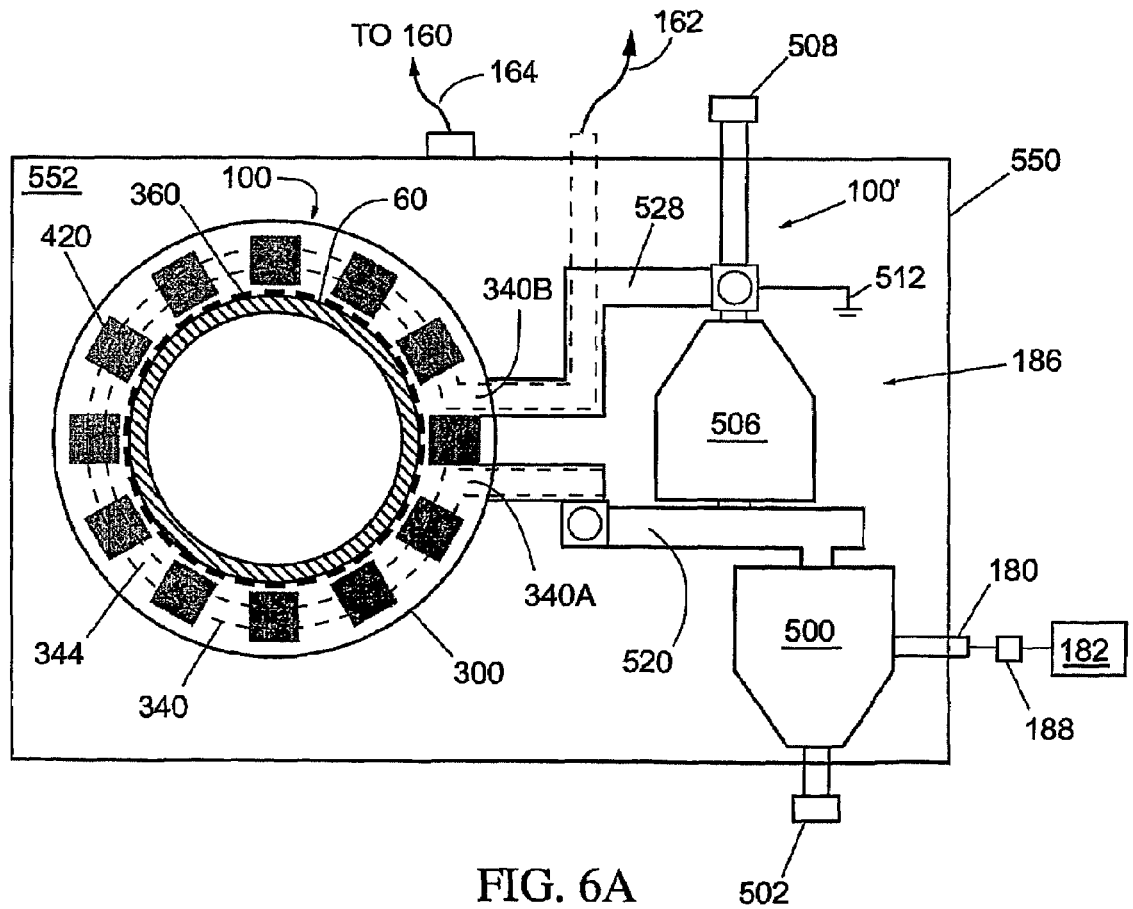
FIG. 6A is a schematic plan view of the plasma source of the present invention showing a preferred embodiment for an enclosure that surrounds the plasma source and the match network.
Figure 6B:
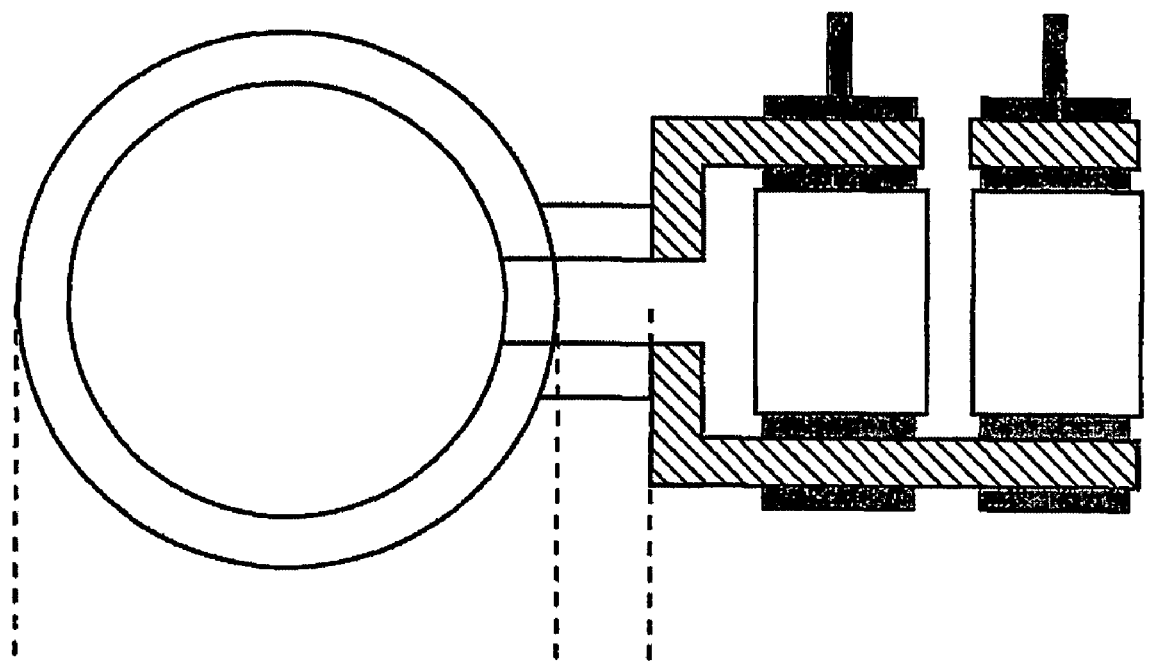
FIG. 6B is a schematic plan view of the plasma source of FIG. 6A with the variable capacitors arranged so that the system has a minimum axial dimension.
Figure 6C:
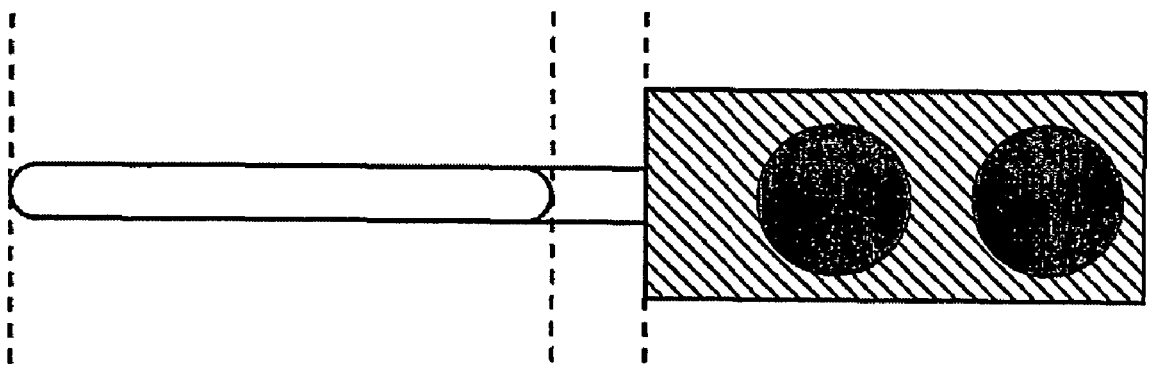
FIG. 6C is a cross-sectional view of the system of FIG. 6B.
Figure 6D:
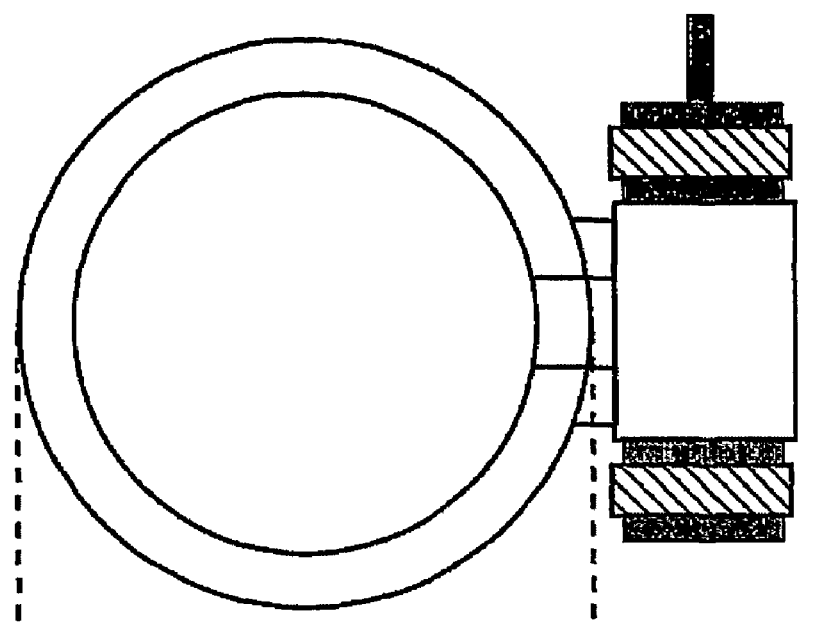
FIG. 6D is a schematic plan view of the plasma source of FIG. 6A with the variable capacitors arranged so that the system has a minimum radial dimension.
Figure 6E:
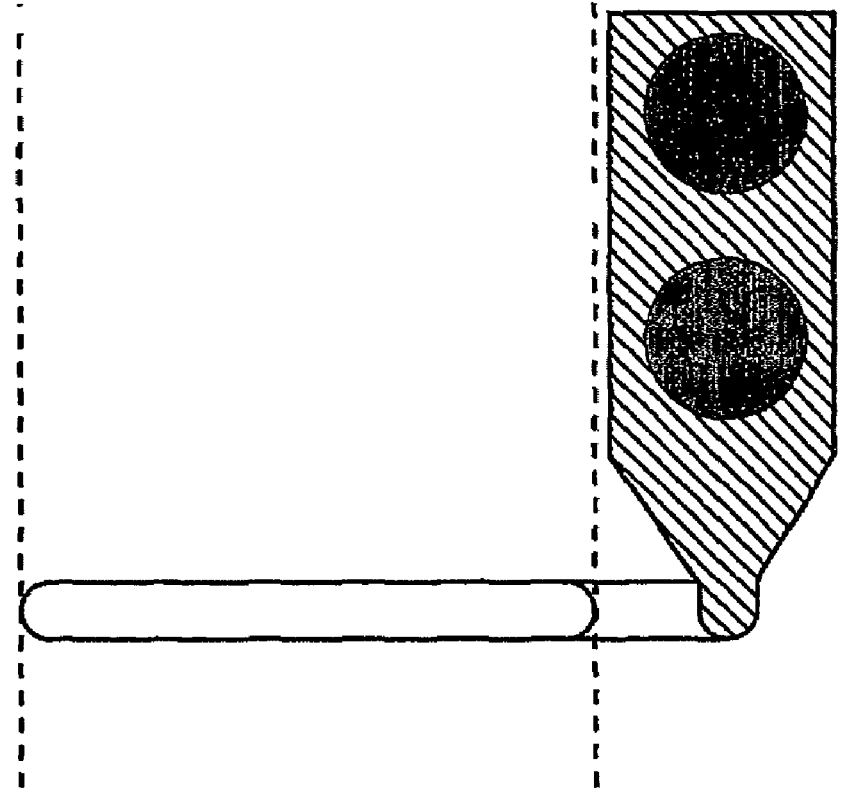
FIG. 6E is a cross-sectional view of the system of FIG. 6D.

With reference again to FIG. 6A, in a preferred embodiment of the present invention, inductor coil 340 is designed to have first and second ends 340A and 340B. First end 340A is connected to line 520 to which first and second variable capacitors 500 and 506 are connected. Second end 340B is connected to a line 528, which is also connected to grounded end 512 of second variable capacitor 506. This is a preferred implementation of the T-match network configuration. With reference to FIGS. 6B and 6C, the first and second variable capacitors 500 and 506 are physically arranged in plane P of inductor coil 340 for minimum axial extent. Alternatively, with reference to FIGS. 6D and 6E, they can be mounted perpendicular to plane P for minimum extent in the radial dimension.

Operational Efficiency of Plasma Source and Match Network Combination

For a single loop antenna with a relatively small diameter, the antenna series resistance r (including the resistance of the copper coil and that of the plasma) is usually very small. The power P delivered to the resistive load equals: $P=i^2r$, where i is the RMS current through the load. Clearly, a very large RF current through the load is required in order to achieve a significant amount of power. Consequently, the circuit resistance must be minimized so the delivered power is mostly used for plasma generation. This can be achieved by placing the capacitor Cp across the load as close to the load as possible. The capacitor itself must also contain as little series resistance as possible. The value of the capacitance should be chosen such that a resonant circuit with the loop inductance L (including what may be contributed from the plasma) is satisfied at the RF source frequency:

$$\omega^{-2}=L(Cs+Cp), \quad (1)$$

which follows from the fact that Cs is connected in parallel with Cp and both are in series with the load.

The capacitor Cp also serves as the shunt capacitor for the impedance transformer between the RF power generator and the load, so the current passing Cs is $$i_s=Cs/(Cs+Cp)i. \quad (2)$$

The power dissipated in the load is then given by $$P=i^2r=i_s^2R \quad (3)$$

where R is the input impedance of the circuit in FIG. 7. Substituting (2) into (3), the input impedance R is given by:

$$R=[(Cs+Cp)/Cs]^2r. \quad (4)$$

Thus, by tuning Cp and Cs of T-match network 540 for the applied RF frequency ω to match the input impedance and output impedance of the power generator Rg, R=Rg, an ideal match is realized.

Note that in T-match network 540 of FIG. 7, elements L and R include contributions from the antenna and the plasma. Before the plasma is turned on, L and r are simply the antenna inductance and the resistance of the circuit, respectively. There is always power dissipation in the circuit alone. Shortening the path length of the closed circuit loop (L, Cp, R-circuit loop) reduces the circuitry loss. Moreover, a low loss vacuum capacitor is preferably used for Cp, and the circuit is preferably kept cool to reduce the resistivity of the conductor in the circuit and the joints.

When the plasma is turned on, the plasma acts as a single-turn secondary of an equivalent transformer terminated by a plasma resistance. The presence of the plasma thus modifies the circuit inductance L and resistance r. Therefore adjustment for Cs and Cp must be made to achieve a good match for the desired plasma condition. The efficiency of the T-match circuit in FIG. 7 can be determined in a simple and elegant manner. The efficiency η is defined herein as the fraction of the total input power P to the power actually absorbed in the plasma $P_{abs}$, viz.

$$\eta = P_{aps}/P = r_{plasma}/(r_{circuit} + r_{plasma}). \quad (5)$$

The load resistance $R_{circuit} = (r_{circuit} + r_{plasma})$ is related to the match input resistance Rg by Equation (4), which is rewritten as $$Rg = 50\Omega = K(r_{circuit} + r_{plasma}), \quad (6)$$

where K stands for the square of the capacitance ratio in Equation (4). In order to determine $r_{circuit}$ and $r_{plasma}$ separately, one can now, without disturbing the capacitor setting, turn off and disconnect the RF power generator from the match. The input resistance of the antenna circuit can then be measured by an impedance meter, viz.

$$R_{circuit} = K r_{circuit}. \quad (7)$$

Consequently, we obtain the efficiency as follows:

$$\eta = P_{aps}/P = r_{plasma}/(r_{circuit} + r_{plasma}) = 1 - R_{circuit}/Rg. \quad (8)$$

Strictly speaking, since the resonance frequency changes slightly when the plasma is turned off, the measured impedance $R_{circuit}$ is not exactly correct. However, as we can see from Table 1, below, this frequency difference is so small as to be of no consequence to the measurement accuracy.

Table 1 below illustrates the plasma source efficiency for different input RF power levels input to the plasma source 100'. The chart illustrates that the efficiency increases with the RF power level from 102 Watts to 1000 Watts of input power $P_{inp}$.

Figure 8:
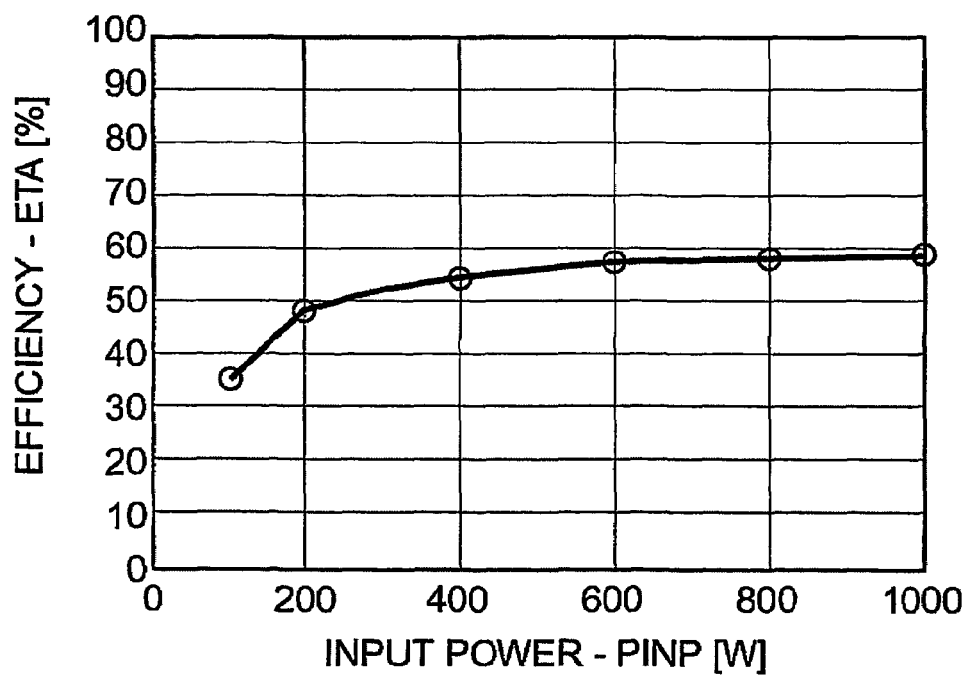
FIG. 8 is a plot of plasma source efficiency vs. the amount of RF power provided to the inductor coil for the plasma source of the present invention, illustrating the efficiency of the plasma source of the present invention.

In the table, R is the input impedance of the circuit measured with plasma turned off and $R_G = 50\Omega$ is the generator resistance (output impedance), which equals to the matched input resistance for the circuit with plasma on, as discussed above in connection with FIG. 7. The data in Table 1 are plotted in FIG. 8. Notice that the measured circuit resonance frequency is only slightly (0.5 MHz) deviated from the applied frequency of 27.12 MHz, the circuit quality factor Q is nearly the same. The error in measuring R is estimated to be about 1% based on the quality factor measurements. The plasma density in the compact plasma source is about $5 \times 10^{12}$ cm$^{-3}$ for 500 W applied power as measured using a Langmuir probe. At 1000 W, the measured plasma density is $1-1.3 \times 10^{13}$ cm$^{-3}$, at pressure 1- to 20 m Torr in Argon gas.

TABLE 1

Input RF signals and corresponding efficiencies for the plasma source and T match network of the present invention

| | After the plasma is extinguished | | Efficiency |
|---|---|---|---|
| Input power $P_{inp}$ [W] | Resonant frequency f[MHz] | Input resistance R[Ω] | $\eta = 1 - R/R_g$ [%] |
| 102 | 27.007 | 32.4 | 35.2 |
| 200 | 26.910 | 26.2 | 47.6 |
| 300 | 26.850 | 24.1 | 51.8 |
| 398 | 26.833 | 23.2 | 53.6 |
| 600 | 26.794 | 22.0 | 56.0 |
| 803 | 26.787 | 21.5 | 57.0 |
| 1,000 | 26.713 | 21.1 | 57.8 |

When compared to an L-type matching network commonly used for inductively coupled plasma (See, e.g., M. A. Lieberman and A. J. Lichtenberg, "Principles of plasma discharges and materials processing", Jon Wiley & Sons, Inc.,), the T-match has four distinct advantages—higher efficiency, larger tuning range, smaller capacitances and smaller capacitors (physical dimensions). These will now be explained in turn.

Efficiency

In a L-match, the large RF current circulates through the series connection of L, $C_s$ and $C_p$, where $C_s >> C_p$. Thus, not only does it flow through both capacitors, but the bulkiness of the capacitors makes the interconnections relatively long, causing resistive losses along the way. On the other hand, the large RF current in a T-match is contained in the loop formed by L and $C_p$. If the parallel capacitor is placed in the immediate vicinity of the load, the lead lengths can be made very short. Furthermore, the RF current flowing through the capacitor $C_s$ is smaller than the RF current through the load, and consequently, the losses are much smaller.

Matching Range

The resistance transformation equation for L match is given by:

$$r = \frac{1}{\omega^2 C_p^2 R_g}. \quad (9)$$

For a T-match the equivalent equation is given by:

$$r = \omega^4 L^2 C_s^2 R_g. \quad (10)$$

We can see from Equations (9) and (10) that matching very low resistance r with a L-match requires very large shunt capacitor $C_p$, while a T-match, on the contrary, requires very small series capacitor $C_s$.

Capacitor Values

Because $C_p$ is usually much larger than $C_s$ in both L and T matching networks, the resonance conditions are determined primarily by the values of $C_s$ in the L-match and $C_p$ in the T-match:

$$C_s^{L-match} \cong C_p^{T-match} \cong \frac{1}{\omega^2 L}. \quad (11)$$

Since these two capacitors have comparable values in both matching networks, it is possible to write:

$$C_p^{L-match} \geq C_s^{L-match} \cong C_p^{T-match} \geq C_s^{T-match}. \quad (12)$$

Thus, a T-match uses smaller capacitors than a L-match. In practice, a trim capacitor having a capacitance range of 3 to 30 pF has been inserted in parallel with a capacitor having a capacitance range of 8 to 1000 pF to serve as the parallel capacitor Cp. A capacitor having a range of 3 to 30 pF has been employed as the series capacitor Cs.

Incorporation of Coolant System into Match Network

In order to increase the plasma production efficiency, the circuit resistance is minimized by incorporation of coolant system 160 (FIG. 1A) into match network 186. With reference again to FIG. 6A, incorporated into match network 186 is coolant in-line 162 that supplies a coolant to interior 344 of inductor coil 340. As described above in connection with FIG. 1A, the coolant flows out of inductor coil 340 through apertures 348 and through coolant channels 324. FIG. 6A illustrates a preferred embodiment of the invention in which an enclosure 550 surrounds both plasma source 100 and a portion of match network 186 within a volume 552. Enclosure 550 also can serve to replace housing 400 described above in connection with FIG. 2. A preferred design also allows the coolant to circulate within volume 552 to cool plasma source 100 and match network 186. The coolant is then removed via coolant out-line 164. As an alternative to this preferred embodiment, match network 186 can reside in its own housing (not shown) that can be sealed to housing 400 (FIG. 2).

The step of cooling plasma source 100' or a portion thereof using the arrangements described above serves to keep the resistance of the various circuit elements low so that the impedance is minimized. For example, while the resistance of inductor coil 340 is normally between 0.1 and 0.2 Ohms, it can get as a high as 0.5 Ohms if the temperature of the coil is allowed to get too high. Likewise, variable capacitors 500 and 506 can also have an increased resistance if their temperature is not controlled. Further, the cooling of plasma source 100 generally is necessary because of the large amounts of heat generated in forming the plasma. Subjecting the various components making up plasma source 100 to such large amounts of heat can reduce their lifetime or cause the components to prematurely fail.

Plasma Source as an Abatement System

Figure 9:
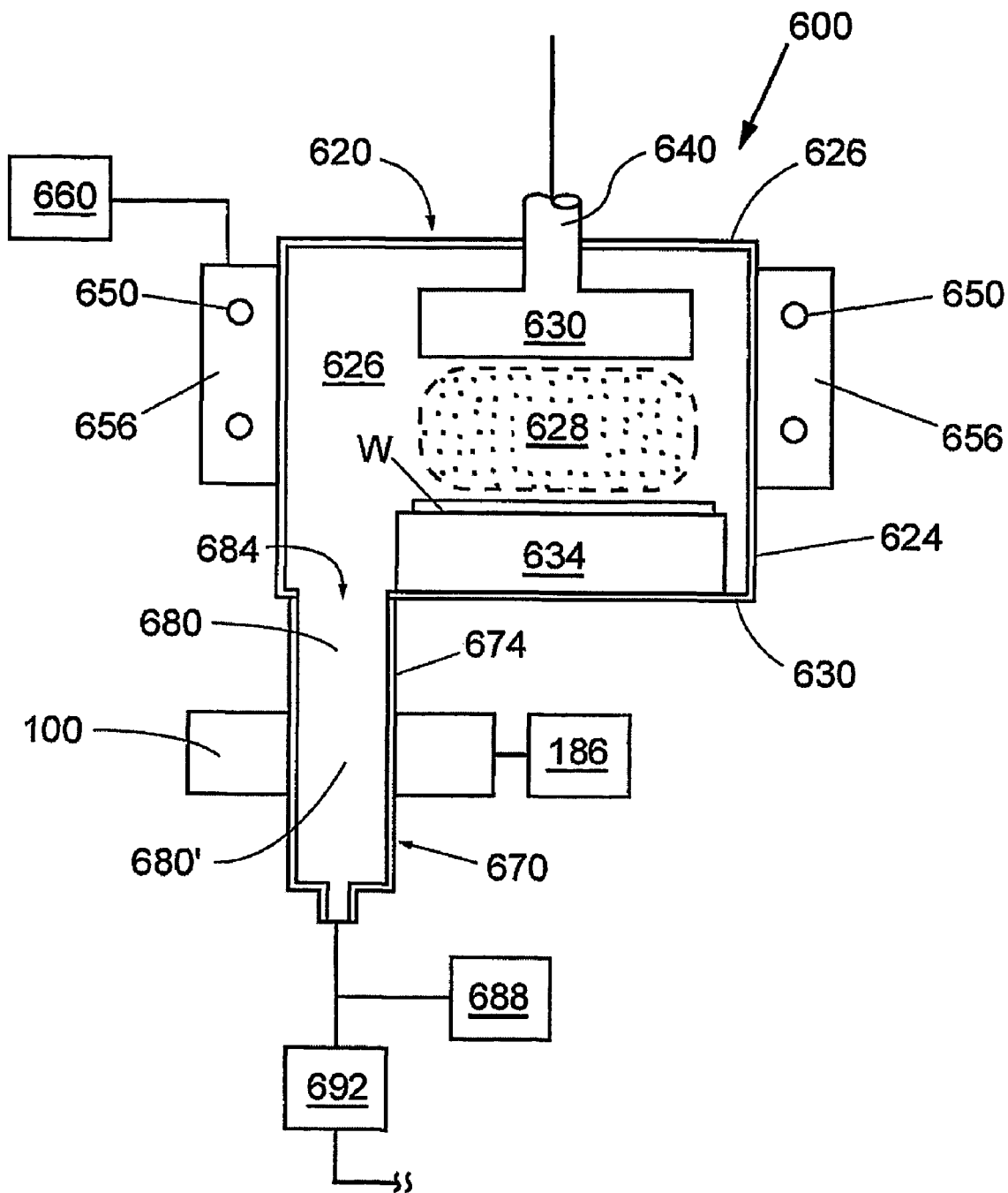
FIG. 9 is a cross-sectional schematic diagram of a plasma reactor system in which the plasma source of the present invention is used as an exhaust abatement system.

Plasma source 100 of the present invention can also be used as an abatement system to reduce, for instance, perfluorocompound (PFC) emission. With reference now to FIG. 9, there is shown a plasma reactor system 600 with a reactor chamber 620 having sidewalls 624, an upper wall 626 and a lower wall 630 enclosing an interior 626 capable of supporting a plasma 628. Chamber 620 is similar to chamber 20 of FIG. 2. An upper electrode 630 is located in interior region 626 above a chuck 634 capable of supporting a workpiece W. Upper electrode 630 includes a gas inlet 640 that allows gas to flow into interior region 626 through upper wall 626. Inductor coil 650 as part of a plasma-forming system 656 surrounds the portion of chamber 620 that houses upper electrode 630, and is connected to a RF source 660.

Attached to chamber 630 near chuck 634 is a plasma duct 670 identical to plasma duct 60 described above in connection with FIG. 2. Plasma duct 670 has sidewalls 674 enclosing an interior 680 that communicates with interior region 626 through an aperture 684 in lower wall 630. Plasma source 100 and match network 186, as described above, are provided around plasma duct 670, thereby defining a plasma generation region 680' within interior region 680. The end of plasma duct 670 opposite the end connected to chamber 620 is pneumatically connected to an exhaust system 688, such as a vacuum pump.

The remaining elements of plasma source 100 are as described above in connection with FIGS. 2-7, and are omitted from FIG. 9 for the sake of illustration.

In operation, plasma system 600 creates plasma 628 adjacent workpiece W residing on chuck 634 by introducing a process gas that may contain, for example, a PFC, such as $CF_4$, $C_4F_8$, $C_5F_8$, etc., into interior region 626 and activating plasma-forming system 656. Also formed are reactant species of gas, such as $CF_3$, $CF_2$, CF, F, etc. Further, upon processing (e.g., etching) workpiece W, other chemical species, such as $SiF_4$, $CO_2$, etc. are formed. Thus, the exhaust from chamber 620 is generally environmentally unfriendly and not suitable for directly exhausting into the atmosphere.

Accordingly, by placing plasma source 100 and match network 186 along the exhaust path, the various gases formed in the interior region 626 during plasma processing can be passed through plasma generation region 680' to alter their chemistry. To ensure the dissociation of environmentally problematic gases, a plurality of plasma sources 100 and associated networks 186 can be arranged in series along the exhaust path.

For example, the plasma-generating properties of plasma source 100 can serve to dissociate a gas, such as unused $CF_4$ into components, i.e., $CF_x$ and F; chemically reactive with hydrogen and oxygen achieved through $H_2O$ dissociation. For example, a very simplistic chemical reaction might be:

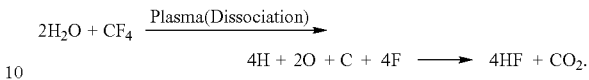

The reaction products can then comprise HF and $CO_2$ gases readily handled by another conventional gas handling "scrubbing" system 692 downstream of exhaust system 688. The processed gases can then be exhausted into the atmosphere, or further filtered and then released into the atmosphere.

Although the use of the plasma source of the present invention is described as a exhaust abatement system in connection with a plasma reactor system, it will be clear to one skilled in the art that the plasma source can be used as an effective abatement system in other kinds of systems where noxious or otherwise undesirable gas products need to be processed prior to being exhausted into the atmosphere.

Variations

In addition to the embodiments described above, other variations are possible. In one such variation, a series of plasma sources (potentially each with at least one set of corresponding magnets) are stacked on top of each other to form a larger plasma source. In another variation, an antenna of more than one turn is used in at least one plasma source.

The many features and advantages of the present invention are apparent from the detailed specification, and, thus, it is intended by the appended claims to cover all such features and advantages of the described apparatus that follow the true spirit and scope of the invention. Furthermore, since numerous modifications and changes will readily occur to those of skill in the art, it is not desired to limit the invention to the exact construction and operation described herein. Accordingly, other embodiments are within the scope of the appended claims.

The invention claimed is:

1. A high-density plasma source for forming a plasma within a plasma duct having an interior region, comprising:
    an annular insulating body including a cylindrical inner surface and a first central axis, with an annular cavity formed within said insulating body and having a second central axis that coincides with the first central axis;
    an inductor coil arranged within said annular cavity operable to generate a first magnetic field within the plasma duct interior region and inductively couple to the plasma;
    a plurality of spaced apart magnets arranged in at least one concentric magnet ring adjacent at least one of an upper and a lower surface of the annular insulating body;
    a grounded conductive housing surrounding said annular insulating body; and
    an electrostatic shield arranged adjacent an inner surface of the annular insulating body and grounded to said conductive housing.

2. The plasma source as claimed in claim 1, further comprising a T-match network in electrical communication with said inductor coil.

3. The plasma source as claimed in claim 2, further comprising a plasma source RF power supply electrically connected to said T-match network.

4. The plasma source as claimed in claim 3, wherein the plasma density in the plasma duct is equal to or greater than about $1\text{-}1.3\times10^{13}$ cm$^{-3}$ for 1000 W RF power provided to said inductor coil by said RF power source.

5. The plasma source as claimed in claim 2, wherein said T-match network is electrically connected to first and second ends of said inductor coil.

6. The plasma source as claimed in claim 2, wherein said T-match network comprises first and second variable capacitors arranged in a plane defined by said inductor coil.

7. The plasma source as claimed in claim 2, wherein said T-match network comprises first and second variable capacitors arranged perpendicular to a plane defined by said inductor coil.

8. The plasma source as claimed in claim 1, wherein said inductor coil comprises a copper coil.

9. The plasma source as claimed in claim 1, wherein said annular insulating body comprises a TEFLON body.

10. The plasma source as claimed in claim 1, wherein said plurality of spaced apart magnets comprises a plurality of spaced apart magnets arranged in first and second concentric magnet rings adjacent an upper and a lower surface of the annular insulating body, respectively, wherein said first and second concentric magnet rings comprise an equal number of magnets.

11. The plasma source as claimed in claim 1, wherein said magnets comprise a ring of magnets arranged in one of a ring-cusp configuration, a mirror field configuration, and a dipole configuration.

12. The plasma source as claimed in claim 1, further comprising a plurality of cooling fluid channels extending from said annular inductor coil cavity within said annular cavity and extending radially inward to an inner surface of the annular insulating body, wherein said inductor coil is capable of carrying a cooling fluid and comprises a plurality of incrementally spaced apertures positioned so as to provide fluid communication between said inductor coil and said coolant channels.

13. The plasma source as claimed in claim 1, wherein said magnets comprise DC field electromagnets.

14. The plasma source as claimed in claim 13, further comprising an electrostatic shield arranged adjacent an inner surface of the annular insulating body.

15. A high-density plasma source for forming a plasma within a plasma duct having an interior region, comprising:
   an annular insulating body including a cylindrical inner surface and a first central axis, with an annular cavity formed within said insulating body and having a second central axis that coincides with the first central axis;
   an inductor coil arranged within said annular cavity operable to generate a first magnetic field within the plasma duct interior region and inductively couple to the plasma,
   a T-match network in electrical communication with said inductor coil; and
   a plasma source RF power supply electrically connected to said T-match network, wherein the plasma density in the plasma duct is equal to or greater than about $5\times10^{12}$ cm$^{-3}$ for 500 W RF power provided to said inductor coil by said RF power source.

16. A plasma reactor system for processing a workpiece, comprising:
   a) a plasma reactor chamber having a central axis, an upper wall and sidewalls surrounding a first interior region capable of supporting a plasma;
   b) at least one plasma duct attached to said upper wall and/or said sidewall of said reactor chamber and having duct sidewalls enclosing a second interior region in communication with said first interior region, the at least one plasma duct comprising plural spaced apart plasma ducts attached to the upper wall and corresponding plasma source and arranged in a disk configuration, or comprising plural spaced apart plasma ducts attached to the sidewall and corresponding plasma sources and arranged in a ring configuration;
   c) a chuck arranged opposite said upper wall for supporting the workpiece; and
   d) a plasma source surrounding a portion of said at least one plasma duct and defining a plasma generation region within said second region, wherein the plasma source comprises:
   an annular insulating body substantially concentric with the central axis, and an inductor coil arranged within said annular cavity operable to generate a first magnetic field within the plasma duct interior region and inductively couple to the plasma.

17. The plasma reactor system as claimed in claim 16, wherein the at least one plasma duct comprises plural spaced apart plasma ducts attached to said upper wall and corresponding plasma sources, arranged in a disk configuration.

18. The plasma reactor system as claimed in claim 16, wherein the at least one plasma duct comprises plural spaced plasma ducts attached to said sidewall and corresponding plasma sources, arranged in a ring configuration.

19. The plasma reactor system as claimed in claim 16, further comprising at least one of:
   i) a gas supply system in pneumatic communication with said plasma duct so as to introduce gas into said plasma generation region;
   ii) a gas distribution system in pneumatic communication with at least one of said plasma duct and said plasma reactor chamber;
   iii) a T-match network in electrical communication with said inductor coil; and a first RF power supply in electrical communication with said T-match network;
   iv) a coolant supply system in fluid communication with said inductor coil;
   v) a vacuum system in pneumatic communication with said first interior region;
   vi) a second RF power supply system in electrical communication with said chuck; and
   vii) a load chamber formed in said reactor chamber sidewalls and enclosing a third interior region in communication with said first interior region, with a sealable door attached thereto sized to allow a workpiece to pass through said third interior region to said chuck, and further including a workpiece handling system in operable communication with said load chamber and said chuck.

20. The plasma reactor as claimed in claim 19, further comprising a control system for controlling the operation of said reactor.

21. The method as claimed in claim 19, further comprising the step of allowing the reactive plasma to interact with a workpiece.

22. A method of forming a high-density plasma in an interior region of a plasma chamber, comprising the steps of:
   a) injecting plasma gas into a plasma generation region of a plasma duct that is in communication with the chamber interior region;
   b) providing RF power through a T-match network to an annular inductor coil surrounding said plasma generation region, thereby generating a first magnetic field within said plasma generation region;

c) measuring an amount of reflected power reflected from said inductor coil passing back through said T-match network; and d) adjusting the capacitance of said T-match network so as to minimize the amount of reflected power measured in said step c).

23. The method as claimed in claim 22, and further comprising the step of passing a cooling fluid through said inductor coil.

24. The method as claimed in claim 22, further comprising the step of injecting a reactive gas into the interior region of the plasma chamber so as to create a reactive plasma.

25. The method as claimed in claim 22, further comprising the step of allowing the plasma to diffuse from the plasma generation region into the interior region of the plasma chamber and interact with a workpiece.

26. A method of forming a high-density plasma within an interior region of a plasma reactor chamber, comprising:

a) injecting plasma gas into a plurality of plasma generation regions, one in each of a corresponding plurality of spaced-apart plasma ducts in communication with the chamber interior region and arranged so as to provide a region of uniform, high-density plasma within the interior region of the reactor chamber;

b) providing RF power through a plurality of T-match networks each corresponding to an independent annular inductor coil surrounding each said plasma generation region, thereby generating a first magnetic field within each said plasma generation region;

c) measuring an amount of reflected power reflected from each said inductor coil passing back through each said T-match network; and d) adjusting the capacitance of each said T-match network so as to minimize the amount of reflected power measured in said step c).

27. The method as claimed in claim 26, further comprising the step of passing a cooling fluid through each said inductor coil.

28. The method as claimed in claim 27, further comprising the step of allowing the plasma to diffuse from the plasma generation regions into the chamber interior region and interact with a workpiece.

29. The method as claimed in claim 26, further comprising the step of injecting a reactive gas into the interior region of the plasma chamber to form a reactive plasma.

30. The method as claimed in claim 29, further comprising the step of allowing the reactive plasma to interact with a workpiece.

31. A method of abating exhaust in a chamber containing a gas and having an exhaust path, comprising the steps of:

arranging a plasma source, including an inductor coil contained within an annular insulating body, around the exhaust path so as to define a plasma generation region within the exhaust path;

activating the plasma source so as to dissociate at least a portion of gas traveling through the exhaust path; and tuning a T-match network of the plasma source to maximize power transfer to gas passing through the plasma generation region.

32. The method as claimed in claim 31, further comprising the step of passing dissociated gas to a scrubbing system downstream of the plasma source.

33. The method as claimed in claim 31, further comprising the step of arranging a plurality of plasma sources along the exhaust path.

34. A match network for regulating a power applied by an RF power supply to first and second ends of an inductor coil, the network comprising:

a first variable capacitor having a third end, coupled to an RF power supply, and a fourth end, coupled to a first end of the inductor coil;

a second variable capacitor having a fifth end, connected to a second end of the inductor coil and to ground, and a sixth end, coupled to the fourth end of the first variable capacitor; and a power meter coupled between the RF power supply and the first variable capacitor.

35. The match network as claimed in claim 34, wherein the first and second variable capacitors are physically arranged in a plane of the inductor coil.

36. The match network as claimed in claim 34, wherein the first and second variable capacitors are physically perpendicular to a plane of the inductor coil.

* * * * *